United States Patent
Sumrall

(10) Patent No.: US 11,788,516 B2
(45) Date of Patent: *Oct. 17, 2023

(54) SYSTEMS AND METHODS OF GENERATING ELECTRICITY USING HEAT FROM WITHIN THE EARTH

(71) Applicant: HMFSF IP HOLDINGS, LLC, Fort Walton Beach, FL (US)

(72) Inventor: Theodore S. Sumrall, Fort Walton Beach, FL (US)

(73) Assignee: HMFSF IP HOLDINGS, LLC, Fort Walton Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/451,473

(22) Filed: Oct. 19, 2021

(65) Prior Publication Data

US 2022/0282716 A1   Sep. 8, 2022

Related U.S. Application Data

(63) Continuation of application No. 16/808,981, filed on Mar. 4, 2020, now abandoned, which is a
(Continued)

(51) Int. Cl.
*F24T 10/17* (2018.01)
*F03G 4/00* (2006.01)
(Continued)

(52) U.S. Cl.
CPC ............. *F03G 7/04* (2013.01); *F03G 4/029* (2021.08); *F24T 10/13* (2018.05); *F24T 10/17* (2018.05);
(Continued)

(58) Field of Classification Search
CPC ... F03G 7/04; F03G 4/00; F03G 4/001; F03G 4/02; F03G 4/023; F03G 4/026;
(Continued)

(56) References Cited

U.S. PATENT DOCUMENTS 3,845,627 A   11/1974  Hutchinson
4,050,517 A    9/1977  Matthews
(Continued)

FOREIGN PATENT DOCUMENTS

KR      20170003809 A  *  1/2017
WO    WO 2012/114297 A2    8/2012

OTHER PUBLICATIONS

International Search Report and Written Opinion dated Dec. 12, 2018 in International Application No. PCT/US2018/052957 dated Sep. 26, 2018.

*Primary Examiner* — Mark A Laurenzi
*Assistant Examiner* — Xiaoting Hu
(74) *Attorney, Agent, or Firm* — Knobbe Martens Olson & Bear LLP

(57) ABSTRACT

Systems and methods for producing energy from a geothermal formation. A heat exchanger can be disposed within a well to absorb heat from a geothermal formation. The heat exchanger can be supported within the well using a high thermal conductivity material. The heat exchanger is connected to an organic Rankine cycle engine including a secondary heat exchanger and a turbine. The primary and secondary heat transfer fluids are chosen to maximize efficiency of the organic Rankine cycle.

20 Claims, 13 Drawing Sheets

Related U.S. Application Data continuation of application No. 16/170,947, filed on Oct. 25, 2018, now Pat. No. 10,598,160, which is a continuation of application No. PCT/US2018/052957, filed on Sep. 26, 2018.

(60) Provisional application No. 62/564,527, filed on Sep. 28, 2017.

(51) Int. Cl.
  *F24T 10/00* (2018.01)
  *F03G 7/04* (2006.01)
  *F24T 10/13* (2018.01)

(52) U.S. Cl.
  CPC ....... *F24T 2010/53* (2018.05); *F24T 2010/56* (2018.05); *F28F 2240/00* (2013.01); *Y02E 10/10* (2013.01)

(58) Field of Classification Search
  CPC ....... F03G 4/029; F28F 2240/00; F24T 10/13; F24T 10/17; F24T 2010/53; F24T 10/00; F24T 10/10; F24T 10/15; F24T 2010/50; Y02E 10/10; F24J 3/08; F24J 3/081; F24J 3/082; F24J 3/083; F24J 3/084; F24J 2003/087; F24J 2003/088
  See application file for complete search history.

(56) References Cited

U.S. PATENT DOCUMENTS

| | | | |
|---|---|---|---|
| 4,224,151 A | 9/1980 | Jost | |
| 4,392,531 A * | 7/1983 | Ippolito | F24T 10/30 166/278 |
| 4,492,083 A * | 1/1985 | McCabe | F03G 7/04 60/641.5 |
| 4,912,941 A * | 4/1990 | Buchi | E21B 43/26 62/260 |
| 2006/0130480 A1 | 6/2006 | Lovelace | |
| 2007/0119495 A1 | 5/2007 | Sumrall | |
| 2008/0073058 A1 | 3/2008 | Ueyama | |
| 2008/0149345 A1 * | 6/2008 | Marya | E21B 23/00 166/376 |
| 2008/0209904 A1 | 9/2008 | Sumrall | |
| 2008/0223032 A1 | 9/2008 | Sumrall | |
| 2010/0206553 A1 * | 8/2010 | Bailey | E21B 17/1085 166/244.1 |
| 2010/0270003 A1 * | 10/2010 | Sarria | C02F 1/048 165/45 |
| 2010/0288465 A1 * | 11/2010 | Stewart | F24T 10/40 165/45 |
| 2013/0192816 A1 * | 8/2013 | Wiggs | F03G 7/04 166/57 |
| 2015/0122453 A1 * | 5/2015 | Colwell | F24T 10/30 165/45 |
| 2016/0363350 A1 | 12/2016 | Tahara | |

* cited by examiner

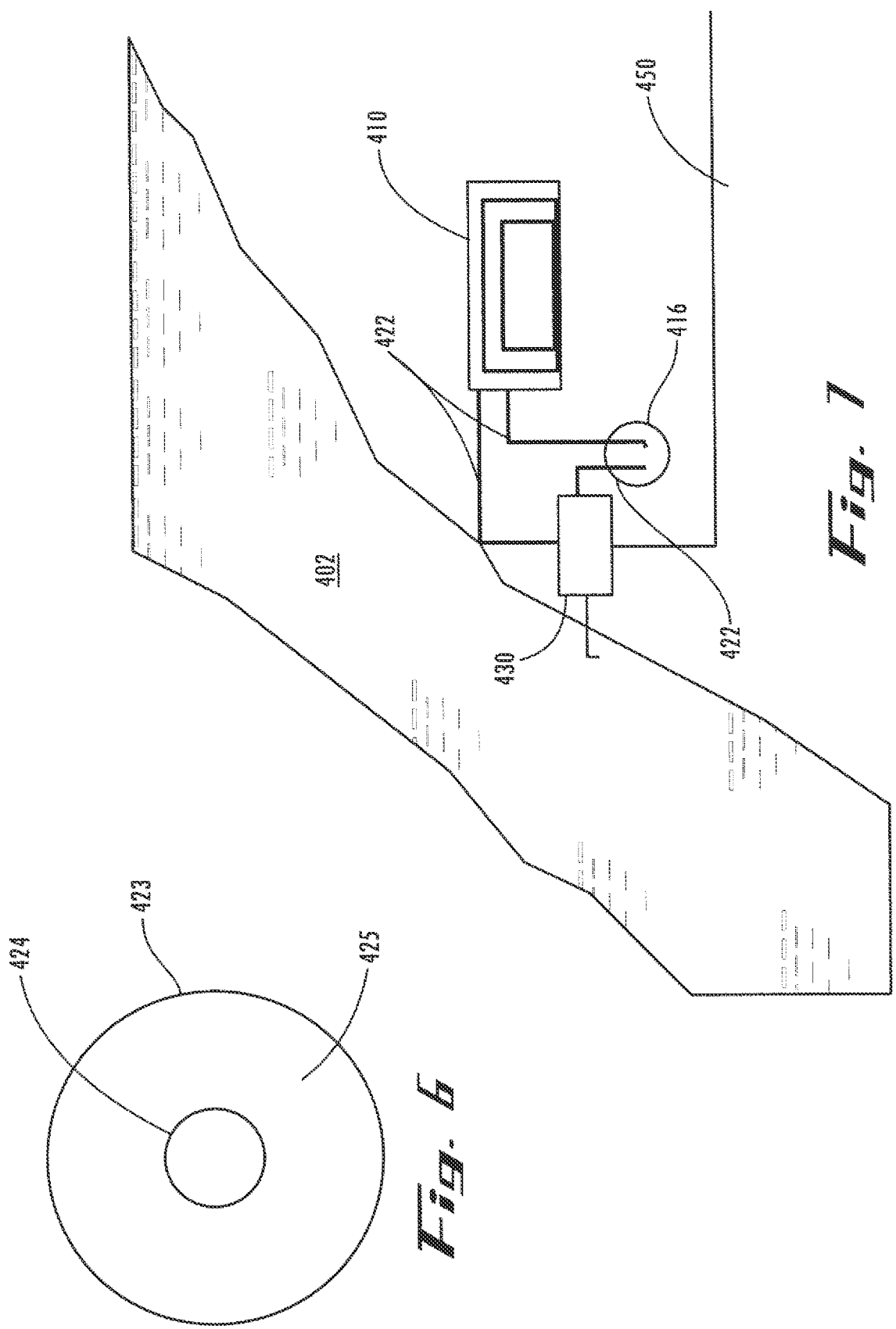

SYSTEMS AND METHODS OF GENERATING ELECTRICITY USING HEAT FROM WITHIN THE EARTH

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. application Ser. No. 16/808,981, filed on Mar. 4, 2020, which is a continuation of U.S. application Ser. No. 16/170,947, filed on Oct. 25, 2018, now U.S. Pat. No. 10,598,160, issued on Mar. 24, 2020, which is a continuation of PCT/US2018/052957, filed on Sep. 26, 2018, which, in turn, claims the benefit of U.S. Provisional Application No. 62/564,527, filed on Sep. 28, 2017, the entire contents each of which are hereby incorporated by reference.

BACKGROUND

Conventional systems for generating electricity for consumption and use by the public include nuclear power, fossil fuel powered steam generation plants and hydroelectric power. Operation and maintenance of these systems is expensive and utilizes significant natural resources, and in some cases results in excessive pollution, either through hydrocarbon combustion or spent nuclear fuel rod disposal. Furthermore, even renewable energy resources such as solar and wind powered systems are only operational for an average of only a few hours per day in some locations while geothermal systems can operate on approximately a 24/7 basis as required.

Therefore, there is a need in the art for systems and methods for generating clean electrical power cheaply which is available on an approximate 24/7 basis without relying upon the import of petroleum materials or building of multi-billion-dollar power plants. There is further a need for systems and methods for generating electricity using heat from within the earth.

SUMMARY

In one aspect described herein, a geothermal energy system comprises a primary heat exchanger positioned within a well, the well in contact with a geothermal feature and a heat carrier within the geothermal formation, the primary heat exchanger containing a first heat transfer fluid configured to absorb heat from the heat carrier in the primary heat exchanger; a secondary heat exchanger in thermal communication with the primary heat exchanger, the secondary heat exchanger containing a second heat transfer fluid, wherein the first heat transfer fluid and the second heat transfer fluid are maintained separate from each other, and wherein the second heat transfer fluid has a flash point below that of water; and a turbine in fluid communication with the secondary heat exchanger, wherein the second heat transfer fluid is vaporized in the secondary heat exchanger and the vaporized second heat transfer fluid is the working fluid in the turbine; and a generator connected to the turbine, the generator configured to generate electricity based on movement of the turbine.

In some embodiments, the primary heat exchanger comprises a supply portion and a return portion, the supply portion comprising a shell in thermal communication with the geothermal feature, and wherein the return portion is concentrically located within the shell of the supply portion.

In some embodiments, the return portion comprises a thermally insulated pipe, wherein the thermally insulated pipe is configured to insulate the hot first heat transfer fluid in the return portion from the relatively colder first heat transfer fluid in the supply portion of the primary heat exchanger.

In some embodiments, the thermally insulated pipe is suspended within the shell of the primary heat exchanger via a plurality of centralizers, the centralizers positioned within the shell of the primary heat exchanger such that the primary heat exchange fluid is in contact with the plurality of centralizers.

In some embodiments, the plurality of centralizers are connected to an outer surface of the thermally insulated pipe and are not connected to an inner surface of the shell.

In some embodiments, the thermally insulated return pipe has a first end located near a bottom portion of shell of the supply portion and a second end connected to the secondary heat exchanger, and wherein the first end of the thermally insulated return pipe is closed and comprises a plurality of perforations therein to allow the first heat transfer fluid to flow from the supply portion into the thermally insulated return pipe.

In some embodiments, the shell comprises a well casing, the casing comprising a plurality of casing segments positioned within the well.

In some embodiments, the plurality of centralizers are connected to an inner surface of the casing at junctions between the casing segments.

In some embodiments, the primary heat exchanger is supported within the well by a cement or grout having high thermal conductivity.

In some embodiments, the primary heat exchanger is supported within the well by a plurality of support collars.

In some embodiments, the primary heat exchanger is suspended at or near the surface of the earth or the sea floor.

In some embodiments, the heat carrier comprises a thermally conductive material inserted between an outer surface of the primary heat exchanger and an inner surface of the wall.

In some embodiments, the heat carrier is a brine flowable within the geothermal formation.

In some embodiments, each of the plurality of support collars comprise a first and second end, wherein the first ends of the plurality of support collars are securely connected to an inner wall of the well, and wherein the second ends of the plurality of support collars contact an outer shell of the primary heat exchanger plurality at a point higher in the well than the corresponding first ends of the plurality of support collars.

In some embodiments, the plurality of support collars support the outer shell of the primary heat exchanger at a position above the bottom of the well.

In some embodiments, the plurality of support collars are positioned within the well such that the plurality of support collars are in contact with the heat carrier in the geothermal formation, and the heat carrier is able to flow around the plurality of support collars to contact the primary heat exchanger.

In some embodiments, the shell comprises an anti-scaling coating on a well-facing surface of the shell, the coating comprising a very smooth non-metallic material which prevents an ionic bonding site from forming, thus preventing scale formation and also inhibiting corrosion.

In some embodiments, the shell comprises an anti-scaling coating on a well-facing surface of the shell, the coating comprising a non-metal material, such as carbon or boron applied via chemical vapor deposition or vapor deposition alloying.

In some embodiments, the shell comprises an anti-scaling coating on a well-facing surface of the shell, the coating comprising an amorphous carbon material that has significant amounts of sp3 hybridized carbon to retard both corrosion and scaling.

In some embodiments, the shell comprises an anti-scaling coating on a well-facing surface of the shell, the coating comprising carbon nitride, boron nitride, to prevent or minimize scaling and corrosion.

In some embodiments, the shell comprises an anti-scaling coating on a well-facing surface of the shell, the coating comprising highly thermally conductive ceramics which resist scaling and corrosion In some embodiments, the first heat transfer fluid is a nanofluid.

In another aspect described herein, a method of generating electricity using geothermal energy comprises moving a first heat transfer fluid into a primary heat exchanger positioned within a well, the well in contact with a geothermal feature and a heat carrier within the geothermal formation; absorbing, in the first heat transfer fluid, heat from the heat carrier in the well; moving the first heat transfer fluid out of the primary heat exchanger and out of the well and into a secondary heat exchanger; transferring heat from the first heat transfer fluid to the second heat transfer fluid within the secondary heat exchanger, vaporizing the secondary heat transfer fluid in the secondary heat exchanger; flowing the vaporized secondary heat transfer fluid into a turbine, the turbine connected to an electrical generator and the vaporized secondary heat transfer fluid moving the turbine; and generating electricity in the electrical generator using the movement of the turbine.

In some embodiments, moving the first heat transfer fluid into the primary heat exchanger comprise moving the first heat transfer fluid down a supply portion of the primary heat exchanger; and contacting, with the first heat transfer fluid, a shell of the primary heat exchanger and a surface of a return pipe disposed concentrically within the shell of the primary heat exchanger.

In some embodiments, moving the first heat transfer fluid out of the primary heat exchanger and out of the well comprises flowing the primary heat transfer fluid through a return pipe disposed concentrically within a shell of a supply portion of the primary heat exchanger, wherein the return pipe is thermally insulated to minimize heat transfer between the primary heat transfer fluid within the return pipe and the primary heat transfer fluid in the supply portion of the primary heat exchanger.

In some embodiments, the primary heat exchanger within the well is supported via a thermal cement or grout having high thermal conductivity.

In some embodiments, the primary heat exchanger is supported within the well via a plurality of support collars.

In some embodiments, the method further comprises flowing the heat carrier between an inner surface of the well and the outer surface of the primary heat exchanger, and around the plurality of support collars.

In some embodiments, the method further comprises inserting the primary heat exchanger into the well, the primary heat exchanger having a plurality of support collars attached thereto, the first end of each of the plurality of support collars being moveably attached to an outer surface of the primary heat exchanger, and a second end of each of the plurality of support collars being temporarily connected to the outer surface of the primary heat exchanger via a degrading connection; and degrading the temporary connection such that the second end of each of the plurality of support collars extends to contact an inner surface of the well.

In some embodiments, the well comprises a casing extending only along a portion of the well, and the method further comprises drilling, using an under reamer, a portion of the well where the casing does not extend to increase the diameter of the well; and positioning the primary heat exchanger in the portion of the well having the increased diameter.

In another aspect described herein, a heat exchanger for use in a geothermal application comprises a casing disposed within a well, having an anti-scaling and/or anti-corrosion layer thereon configured to contain a heat transfer fluid, the casing forming a shell to hold a heat transfer fluid; a plurality of support collars disposed within the well, the plurality of support collars supporting the casing within the well, the plurality of support collars disposed at a generally upward angle from an inner surface of the well toward the casing; a return pipe disposed co-axially within the cylindrical shell, wherein the arrangement of the casing and the return pipe form an annulus between the return pipe and the cylindrical shell, the inner volume of the return pipe being thermally insulated from the annulus; a plurality of centralizers disposed within the annulus, each of the plurality of centralizers comprising a first end and a second end, the first end of the plurality of centralizers connected to an inner surface of the shell and the second ends of the plurality of centralizers connected to an outer surface of the return pipe, the centralizers having a low profile to minimize hydraulic resistance to flow within the annulus; and wherein the plurality of support collars are configured to allow flow of a heat carrier between the inner surface of the well and the casing.

BRIEF DESCRIPTION OF THE DRAWINGS

FIG. 6 is an illustration of an exemplary pipe structure including an interior pipe and an exterior pipe according to an exemplary embodiment.

FIG. 7 is an illustration of a thermoelectric generation system according to an exemplary embodiment.

DETAILED DESCRIPTION

Figure 1:
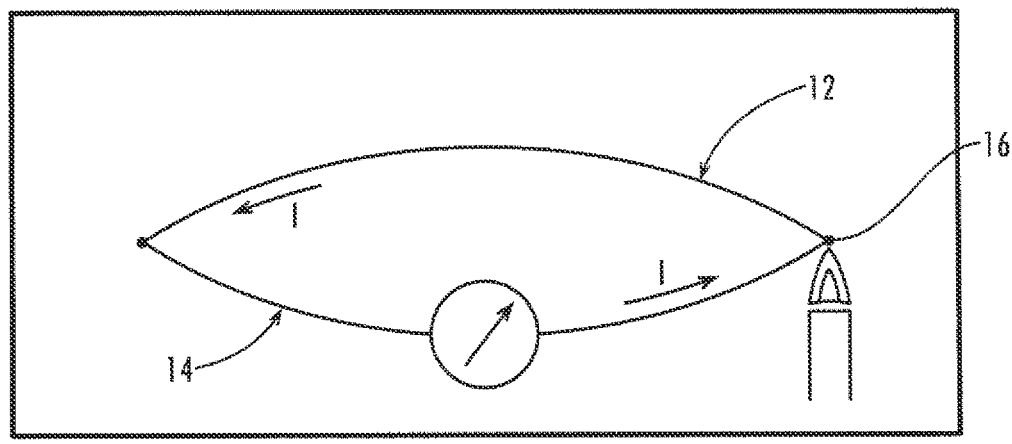
FIG. 1 is a diagram illustrating the Seebeck Effect for thermoelectric systems according to an exemplary embodiment.

The invention now will be described more fully hereinafter with reference to the accompanying drawings, in which an exemplary embodiment of the invention is shown. This application may, however, be embodied in many different forms and should not be construed as limited to the embodiments set forth herein; rather, this embodiment is provided so that this disclosure will be thorough and will fully convey the scope of the invention to those skilled in the art. Like numbers refer to like elements throughout.

Some embodiments of the current disclosure utilize deep wells (for example, abandoned or non-utilized oil, gas and geothermal wells) which can be obtained for very little investment and fit them with a medium recirculation type system to provide sufficient heat energy for electrical power generation, direct heating and/or water condensation. For example, the power generation means may include thermoelectric generators, Stirling engines, Rankine engines, Matteran energy cycle engines, flash power plants, dry steam power plants, binary organic Rankine cycle power plants, flash/binary combined cycles, and the like. The deep wells may generate heat energy while a separate lower temperature source may provide a cold source for creating a temperature differential, a heat sink, or the like, as is used by the various power generation means described herein. For example, the separate lower temperature source may be provided by water obtained from a variety of sources including an ocean, sea, gulf, river, stream, creek, lake, spring, or from any underground source such as underground wells or from public water systems. The power generation means may be used to provide power for public, private and government consumption.

Methods and systems of the current disclosure have many inherent advantages resulting from the efficient design that takes advantage of available energy sources and which limits the physical and ecological footprint and waste resulting from its use. For example, designed as a closed loop or substantially closed loop process, some disclosed embodiments can reduce pollution and unnecessary introduction of non-natural materials to the surrounding environment when in use, including into the earth's surface, underground, and into the earth's atmosphere. Furthermore, the closed loop nature and the reliance on existing energy sources reduces the creation of additional waste or undesirable byproducts as are often generated with current geothermal energy generation systems. Through the use of heat energy already existing within the earth, embodiments of the invention may additionally provide an untapped alternative energy source, overcoming many of the fuel dependency problems currently faced. Embodiments of the invention may also be scalable through the inclusion of multiple energy generation means and multiple heat sources, providing an alternate energy source for local use and/or for contributing to larger private or public grids. Additionally, scalability may be achieved through economically prudent system construction, avoiding excessive construction costs, time, and space. Finally, embodiments of the invention create an opportunity to leverage existing energy already accessible via non-producing wells, such as spent wells or exploration wells, that otherwise may be unused or under-utilized.

A first example embodiment described herein may include a thermoelectric generator comprising a thermopile, a hot junction, and a cold junction. The hot junction of the thermopile may be coupled to a high temperature source comprising heat from within the earth's surface. Additionally, the cold junction of the thermopile may be coupled to a low temperature source from a body of water, which may be geographically separated from the cold junction. The high temperature source and the low temperature source thus may create a temperature gradient at the thermopile for generating electricity.

As illustrated in FIG. 1 continuously flowing electrical current may be created when a first wire 12 of a first material is joined with a second wire 14 of a second material and then heated at one of the junction ends 16. This is known as the Seebeck Effect. The Seebeck effect has two main applications: temperature measurement (thermocouple) and power generation. A thermoelectric system is one that operates on a circuit that incorporates both thermal and electrical effects to convert heat energy into electrical energy or electrical energy to a decreasing temperature gradient. The combination of the two or more wires creates a thermopile 10 that is integrated into a thermoelectric system. When employed for the purposes of power generation, the voltage generated is a function of the temperature difference and the materials of the two wires used. A thermoelectric generator has a power cycle closely related to a heat engine cycle with electrons serving as the working fluid and can be employed as power generators. Heat is transferred from a high temperature source to a hot junction and then rejected to a low temperature sink from a cold junction or directly to the atmosphere. A temperature gradient between the temperatures of the hot junction and the cold junction generates a voltage potential and the generation of electrical power. Semiconductors may be used to significantly increase the voltage output of thermoelectric generators.

Figure 2:
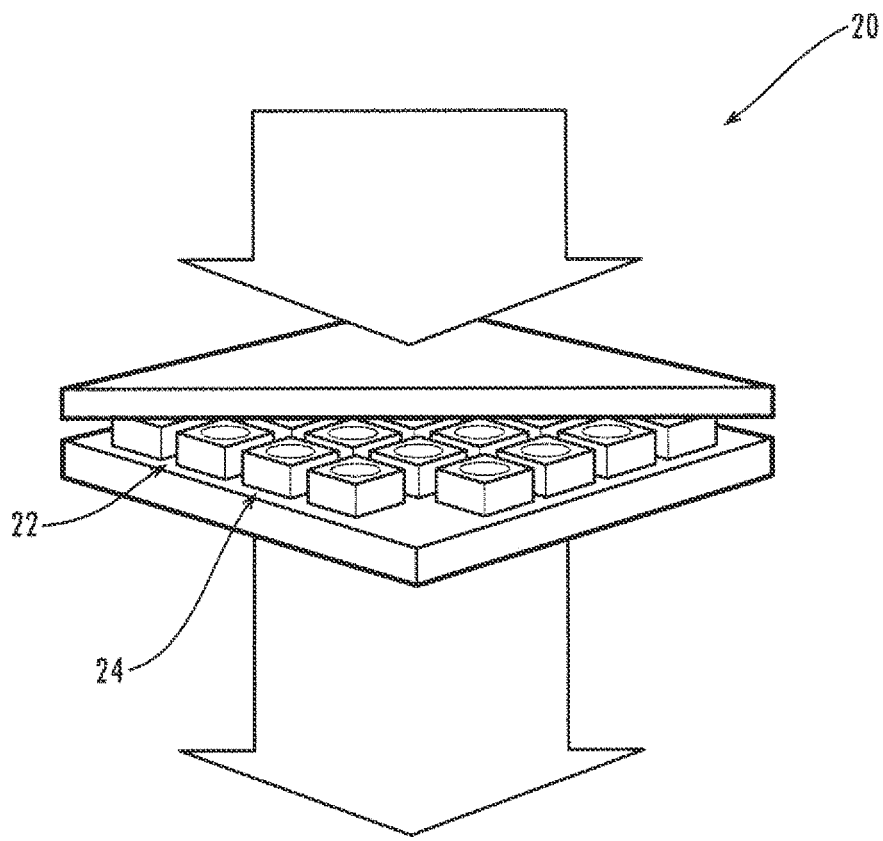
FIG. 2 illustrates a thermopile of the thermoelectric system according to an exemplary embodiment.

FIG. 2 illustrates a thermopile 20 constructed with a n-type semiconductor material 22 and a p-type semiconductor material 24. For increased electrical current, the n-type materials 22 are heavily doped to create excess electrons, while p-type materials 24 are used to create a deficiency of electrons.

Thermoelectric generator technology is a functional, viable and continuous long-term electrical power source. Due to the accessibility of temperature gradients occurring in natural and man-made environments, thermoelectric generators can provide a continuous power supply in the form of electricity. One of the most abundant, common, and accessible sources of energy is environmental heat, especially heat contained within the earth's crust.

Figure 3:
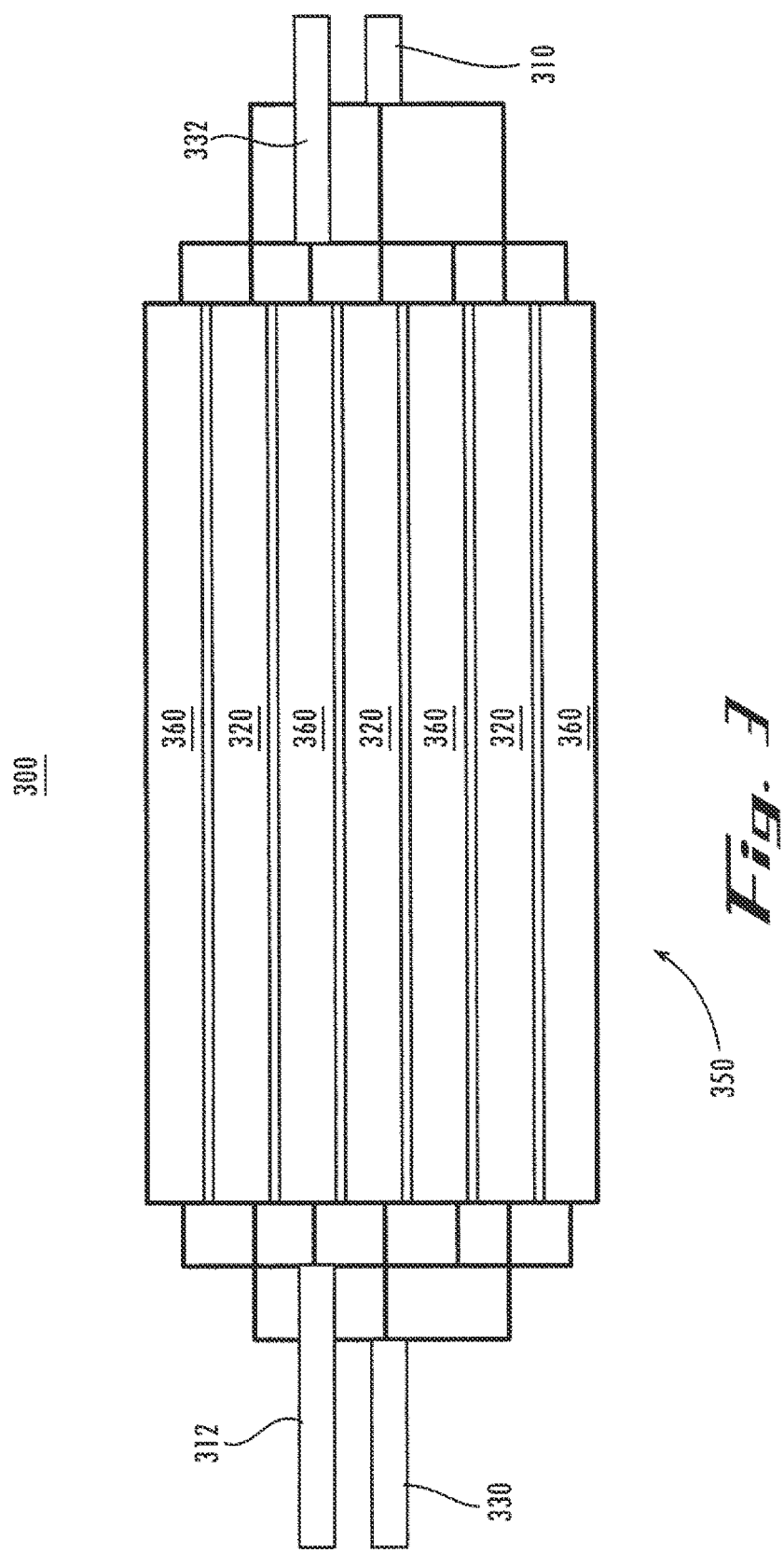
FIG. 3 illustrates a thermoelectric generator according to an exemplary embodiment.

FIG. 3 illustrates an embodiment of the thermoelectric generator. The thermoelectric generator 300 may include an input 310 to a plurality of hot junctions 320 and an output 330 to the plurality of hot junctions 320. The hot junctions 320 may include any source of heat for heat transfer. In an exemplary embodiment, the source of heat is a hot plate 332. The hot plate 332 may be metal or any other conductive material. The hot plate 332 may interface the thermopile 350 to provide heat to the thermopile through conduction, convection, radiation, or any other heat transfer means. One of ordinary skill in the art will appreciate that any thermoelectric generator may be used herein and is not limited to this embodiment. Any system that allows the heat to access the thermopile is contemplated herein.

The thermoelectric generator 300 may further include a plurality of cold junctions 360. The cold junctions 360 may include a cold plate 312 for heat transfer. Alternatively, heat may be radiated or convected away from the cold junctions 360. The cold plate 312 may be metal or any other conductive material. The cold plate 312 may interface the thermopile 350 to provide a conductive heat sink. Voltage potential may be created across the thermopile 350 from a temperature gradient between the temperature of the hot plate 332 and the temperature of the cold plate 312. The greater the temperature gradient, the more electrical power may be generated. One of ordinary skill in the art will appreciate that any thermoelectric generator may be used herein and is not limited to this embodiment.

Any system that provides a heat sink that interfaces thermopile is contemplated herein, including naturally occurring sources of heat absorption such as a fluid. In an exemplary embodiment, the fluid is water. Water may be obtained from any source including an ocean, sea, gulf, river, stream, creek, lake, spring, or from any underground source such as underground wells or from public water systems for the purposes of this application. Since the water is used to absorb heat, water from a public water system used as the heat sink herein may serve an ancillary purpose of preheating the water to decrease the power required by the public, government, or industry to heat the water for any desired use. Water or any fluid as the low temperature source provides a technical benefit over air or gas by having a higher heat transfer coefficient and therefore providing better heat transfer with the cold junction.

Figure 4:
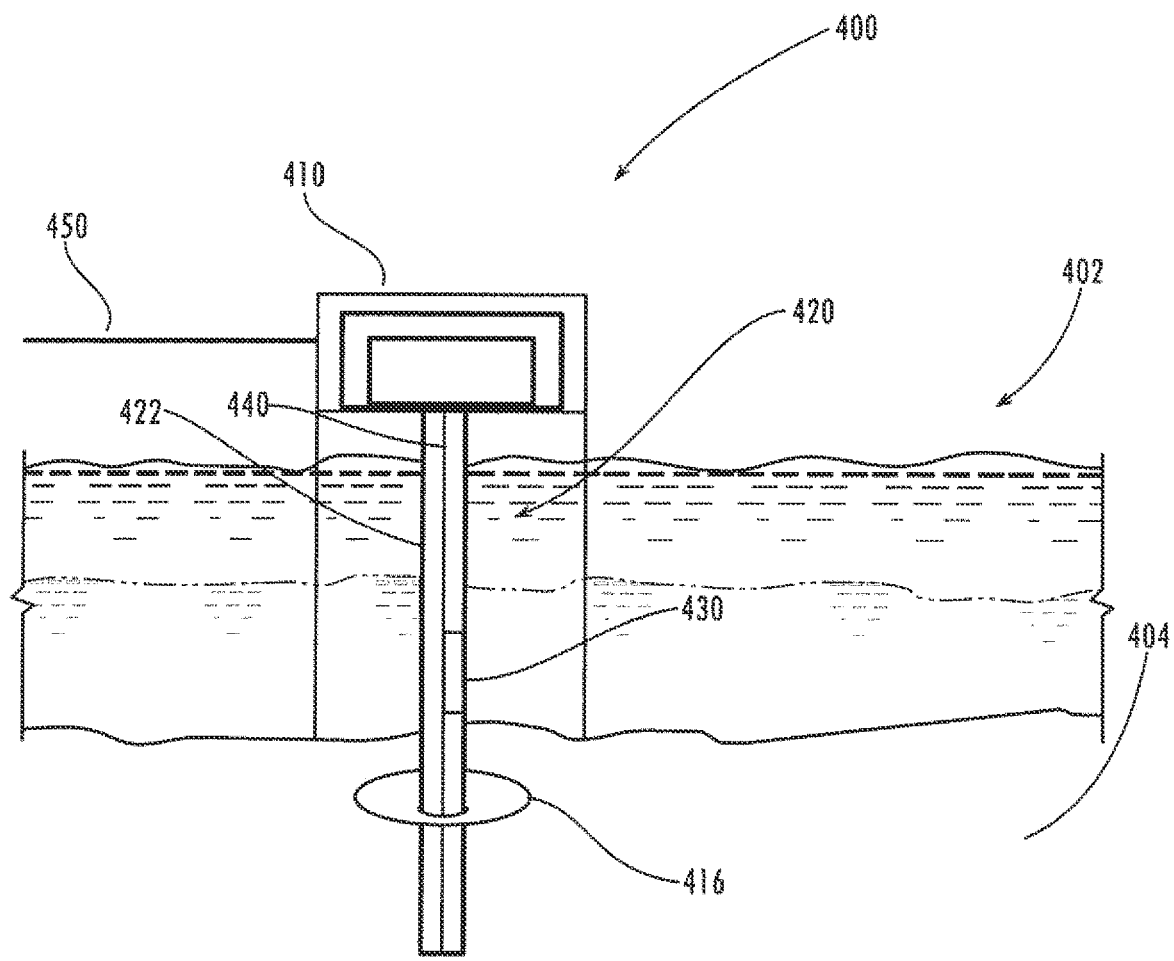
FIG. 4 is an illustration of a thermoelectric generation system according to an exemplary embodiment.

FIG. 4 illustrates an exemplary embodiment of a thermoelectric generation system 400. A thermoelectric generator may be used in the thermoelectric generation system to produce electrical power from a temperature gradient between a low temperature source and a high temperature source. The thermoelectric generation system 400 may be located in or near a body of water 402 including but not limited to an ocean, gulf, sea, lake, river, spring, creek, or any other relatively cooler body of water. The thermoelectric generation system 400 utilizes the body of water 402 as the low temperature source for the thermoelectric generator.

The body of water 402 can provide significantly lower temperatures to the thermoelectric generator to increase the temperature gradient. In a body of water 402, such as an ocean, gulf, sea, or lake, the temperature of the water decreases with depth. At a depth commonly referred to as the thermocline, the water temperature significantly decreases. The depth at which a thermocline occurs averages between 30 and 50 meters, and varies throughout the world. It is preferred for the low temperature source to be water at a depth below the thermocline to provide a continuous source of cold water, and preferably in a current to allow a continuous flow of cool water so that the water is not stagnant and therefore rises in temperature throughout energy production operations. Additionally, location of the power plant adjacent to some other surface body of relatively cooler water will allow the water to flow through the plant and then be dis-charged with minimal thermal change of the water.

Accordingly, the low temperature source may either be in direct contact with the cold junction, or alternatively may be geographically separated from the cold junction and fluidly communicate by a pipe or other means of medium transport.

Figure 5:
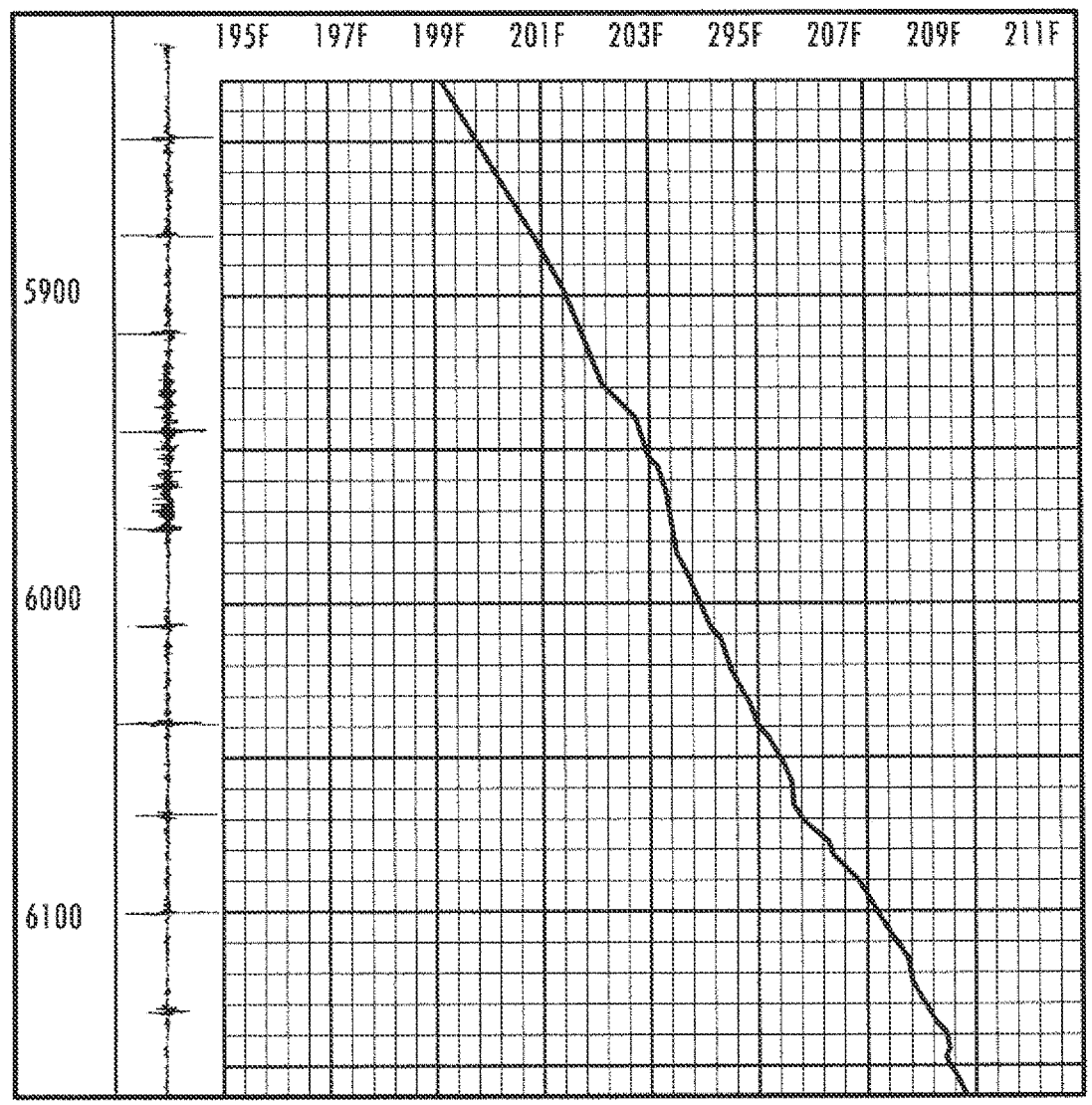
FIG. 5 is an illustration of temperatures within the earth's surface according to an exemplary embodiment.

The high temperature source may be provided from within the earth's crust 404. The earth provides a continuous, inexpensive source of extremely high heat. As illustrated in FIG. 5, the temperature within the earth generally increases towards the core of the earth at an average rate of approximately 1 degree Fahrenheit for every 60 feet of depth. Therefore, locations deep within the earth may be used as the high temperature source for the hot junction of the thermoelectric generator. Locations within the earth may be accessed through drilling or other means for creating a hole 416 in the ground and water or some other type of heat transfer medium circulated through the hole and brought to or near the surface to allow for heat transfer to occur by the employment of high efficiency pumps or some other method.

Certain holes, commonly referred to as dry holes may be used to access the high temperatures within the earth's crust. Dry holes typically exist from the unsuccessful efforts of the petroleum industry to locate oil or gas. The petroleum industry drills wells deep into the earth's crust for the exploration for petroleum. The overwhelming majority of exploration wells drilled throughout the world do not locate petroleum and are thereby indicated as "dry holes." Dry holes provide relatively easy access to the subterranean levels and high temperature conditions. Dry holes may be located on land or in a body of water. Dry holes may reach depths in excess of 30,000 feet. However, one of ordinary skill in the art will appreciate that dry holes may be any depth and can be either active or inactive functioning or non-functioning oil, gas and/or geothermal wells.

FIG. 5 shows the relationship between temperature and depth in the earth's crust for an exemplary well. As shown in FIG. 5, temperatures in the wells or dry holes can reach very high temperatures. In the exemplary depiction in FIG. 5, temperatures in a dry well are approximately 209° F. at 6100 feet. One of ordinary skill in the art will appreciate that the present disclosure is not limited to the use of dry holes and may include any hole or well in the earth's crust which can provide a heat source including holes drilled for use by a thermoelectric generator as well as expended or unused oil and gas wells. FIG. 5 is exemplary for one well. In some wells temperature profiles can vary, and down hole temperatures can be greater than 209° F. at 6100 feet.

Referring again to FIG. 4, the thermoelectric generation system may include a pump station 410, a pipe system 420, a thermoelectric generator 430, and a heat transfer fluid 440. The thermoelectric generation system may be positioned in or proximate to a body of water 402. The pump station 410 may include a pump and associated housing for the pump. The pump may be any commercially available or specially designed pump that is capable of forcing fluid to flow at a suitable volumetric rate. The pump station 410 may be located on land, above the water surface, or underneath the water. The pump station 410 is connected to the pipe system 420. The pipe system 420 includes at least one pipe 422. The pipe 422 may include an inner bore or inner channel for carrying fluid heat transfer 440 to be heated by the earth. The inner bore may be any suitable diameter that allows sufficient heat transfer fluid 440 to be pumped through the pipe system. The pipe 422 extends from the pump station 410 into the hole 416 and may be substantially U-shaped such that the pipe 422 ascends out of the hole.

The pipe system 420 may interface a hot junction 320 of the thermoelectric generator 430. The inner bore of the pipe 422 of the pipe system 420 is accessible to an input of the hot junction 320 of the thermoelectric generator 430. The pipe system 420 extends from an output of the hot junction 320 of the thermoelectric generator 430 to return to the pump station 410.

Accordingly, the pipe system 420 may be configured in a closed loop or a substantially closed loop configuration between the pump station 410 and the thermoelectric generator 430. More specifically, the heat transfer medium being pumped from the pump station 410 into the high temperature source existing under the earth's surface (for example, within an existing well) and back to the surface to the hot junction 320 of the thermoelectric generator may never become exposed to the surrounding elements within and be entirely contained in the pipe system 420 until its interface at the hot junction. However, it is appreciated that it may be necessary to add, replace, or replenish the heat transfer medium at the pump station 410.

In some embodiments, the pump station 410 provides a positive pressure to a first portion of the pipe system 420 and pumps the heat transfer fluid 440 downward from the surface into the hole 416, where the fluid absorbs heat from the geological formation. The heat transfer fluid 440 then flows upward through the inner bore of the pipe 422 to the thermoelectric generator 430, where the heat transfer fluid 440 gives up heat to the thermoelectric generator 430. The heat transfer fluid 440 then recirculates through the pump station 410, and is again forced downward, and the cycle repeats.

In some embodiments, the pumping station 410 provides a suction or vacuum force on the pipe system 420, thereby drawing fluid from a portion of the pipe system 420, such as from the portion of the pipe system 420 in thermal communication with the thermoelectric generator 430. The heat transfer fluid 440 then gravity drains, or, as desired, is drawn downward into the hole to circulate.

In an exemplary embodiment illustrated in FIG. 6, the pipe system may include an exterior pipe 423 and an interior pipe 424 such that an annulus 425 exists between the interior pipe 424 and the exterior pipe 423. In this exemplary embodiment, the fluid 440 may be pumped into the hole through the interior pipe 424, and the fluid 440 heated by the earth may be pumped out the hole 416 through the annulus 425 to the hot junction 320 of the thermoelectric generator 430.

In some embodiments, the fluid 440 to be pumped into the hole through the annulus 425 and pumped out of the hole through the interior pipe 424. It is appreciated that, depending upon the surrounding environment and temperatures that the pipe system 420 will be interfacing, the returning fluid pumped down-ward through the annulus 425 may additionally insulate the heated medium pumped up through the interior pipe 424.

In another embodiment of the thermoelectric generation system illustrated in FIG. 7, the hole 416 may be located on the land proximate to a body of water. The hole 416 may provide the high temperature source for the hot junction as described previously. The body of water 402 may provide the low temperature source for the cold junction. The body of water 402 may be a river, spring, creek, lake, or any other cold water supply. The cold junction 360 of the thermoelectric generator 430 is thermally coupled to the body of water 402. The cold junction 360 may interface directly with the body of water 402 or the body of water may be directed to the cold junction 360 using a pipe 422 of a pipe system or other means of channeling the water such as a heat exchanger. The cold junction 360 is cooled to approximately the temperature of the water interfacing the cold junction. The thermoelectric generator 430 creates a voltage potential across the hot junctions 320 and the cold junctions 360 of the thermoelectric generator 430. The use of the heat from the earth to control the temperature of the hot junction 320 and the coldness of the surface or near surface water to control the temperature of the cold junction 360 maximizes the temperature gradient and produces significant amounts of electrical power through the employment of the thermoelectric modules. The electricity generated from the thermoelectric generator 430 may transmitted through power lines 450 to any destination.

Figure 8:
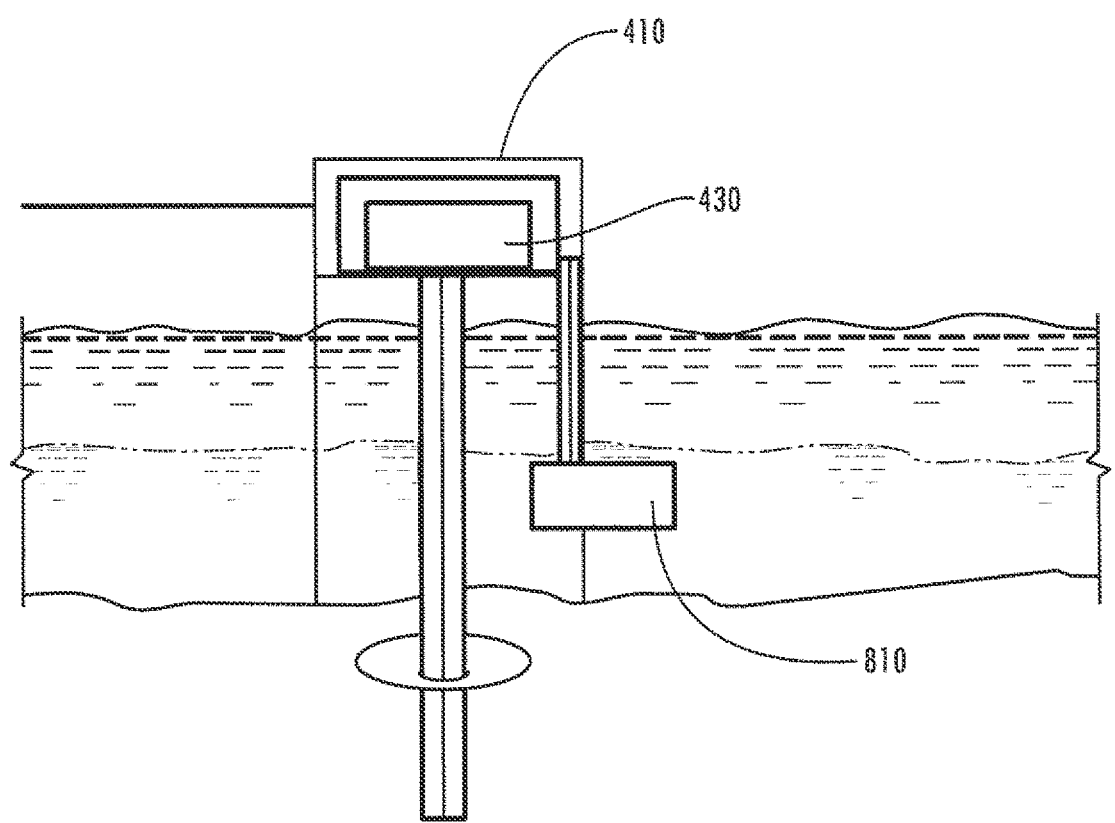
FIG. 8 is an illustration of a thermoelectric generation system according to an exemplary embodiment.

In another embodiment of the thermoelectric generation system illustrated in FIG. 8, the low temperature source for the cold junction 360 may be water from a chiller device 810 residing at, above, or below the surface of the earth. Due to the low temperatures immediately below the earth's surface, the chiller device 810 may be used to lower the temperature of the water. In an exemplary embodiment, the chiller device may be placed at a depth up to approximately 300 feet below the surface. At approximately 300 feet below the surface, the temperature generally begins to increase with depth. One of ordinary skill in the art will appreciate that the 300 feet level is only an approximation and that the depth may vary depending on location on the earth and is therefore not limited to the 300 feet approximation. The chiller device 810 may be powered from electricity generated from the thermoelectric generator.

The utilization of water as the medium for heat transfer from deep within the earth's crust may cause corrosion of a metal pipe system. Hot water, especially when containing oxygen, may rapidly corrode metal. To reduce corrosion, a de-oxygenation mechanism, such as a high vacuum, may be employed to remove oxygen from the water. Alternatively, non-corrosive metals such stainless steel may be used for the pipe system. In another embodiment, the pipe system may include high temperature resistant and non-corrosive plastic piping. An exemplary embodiment of the plastic piping is piping manufactured from PARMAX® materials. One of ordinary skill in the art will appreciated that any non-corrosive and temperature resistant plastic may be used. In yet another embodiment, corrosive preventative substances may be used to minimize corrosion. For example, chromates or other chemicals may be used. As an alternative to water, a non-corrosive fluid such as a synthetic oil or mineral oil or specialty heat transfer fluid may be used to absorb the heat from within the earth's crust for the high temperature source. Oil has the added advantage of being able to be heated to a higher temperature than water and therefore more power may be drawn from the thermoelectric generation system in this manner.

The thermoelectric generator can be protected from the low temperature source during operation to extend the life of the thermoelectric generator. Protection may be in the form of chemical protection or any other source. The cold junction may include ceramic materials to resist corrosion from the water. The thermoelectric generator also may be sealed such that water does not engage or corrode the thermopiles.

The thermoelectric generator may include off-the-shelf thermopiles. The thermoelectric generators also may employ specially designed thermopiles, such as Quantum Well Thermoelectric Generators, that will substantially increase power generation.

The thermoelectric generator also may employ nanowires to increase the efficiency of the system. The nanowires increases the density of states. The nanowires may be arranged in a substantially parallel array to transport generated electricity. The thermoelectric generator also may include quantum dots to increase the efficiency of the system and lowers the thermal conductivity of the system.

In another embodiment of the thermoelectric generation system, the high temperature source for the hot junction may be from a mud pit. Mud from the mud pit is used as a drilling fluid for oil well drilling. The mud extends to the bottom of the hole being drilled for oil exploration. The mud is heated from the drilling and the high temperatures from within the earth's surface. The hot junction of the thermoelectric generator may interface the mud pit to access the high temperature of the mud. The high temperature of the mud may be used to increase the change in temperature across the thermopile and to increase electrical generation.

The thermoelectric generation system may have several advantages over conventional systems of power generation. For example, the thermoelectric generation system has minimal pollution concerns due in part to its operation as a closed loop system and will rely upon minimal, if any, introduction of non-natural materials. The thermoelectric generation system will have minimal waste and minimal atmospheric emissions. The thermoelectric generation sys-tem also is completely renewable. The thermoelectric generation system also may be scaled down to a level which can provide power for a local area. The thermoelectric generation system may be inexpensive to construct and operate compared to conventional power systems and also may take advantage of non-producing oil wells instead of having to cap the wells that are non-productive or to drill new holes.

Figure 9A:
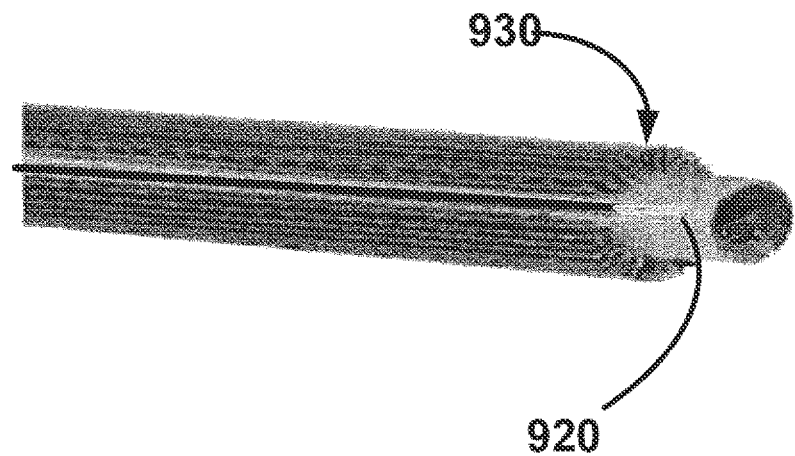
FIGS. 9A and 9B is an illustration of a pipe system according to an exemplary embodiment.
Figure 9B:
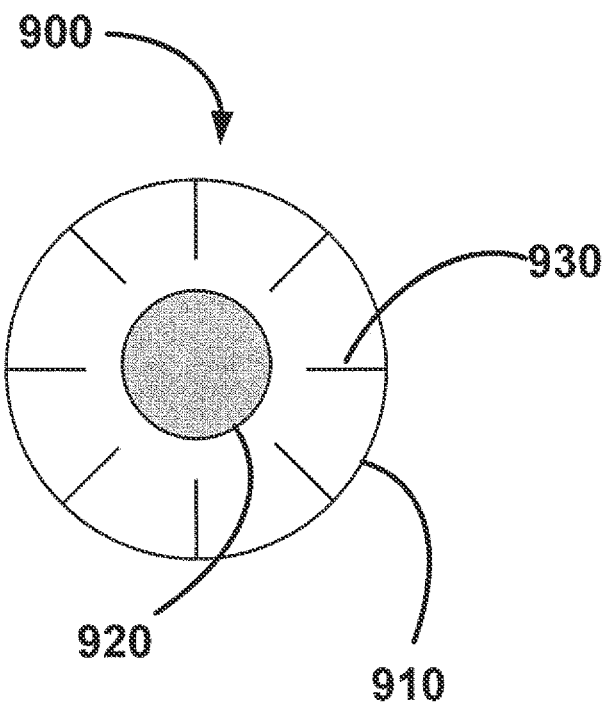

FIGS. 9A and 9B illustrate another exemplary embodiment of a pipe system 900 having both an exterior pipe 910 and an interior pipe 920, arranged concentrically, as is described above with reference to FIG. 6. As illustrated by FIG. 9A, the interior pipe 920 includes a plurality of fins 930 affixed to the exterior surface of the pipe, and which may run along at least a portion of the pipe length and extend radially outward. In one example, the fins 930 may run substantially the entire length of the pipe. In another example, however, the fins 930 may be affixed to the interior pipe 920 along a length at or near the distal portion of the pipe system 900. The fins 930 may facilitate geothermal heat transfer from the earth to the medium being circulated therethrough, and further facilitate heat dissipation within the medium. Thus, in an embodiment of the pipe system 900 including fins only at a distal portion of the pipe system 900 would provide the increased heat transfer mechanism at or near where the deepest portion of the pipe system where the geothermal energy is the greatest. Alternatively, in another example embodiment illustrated by FIG. 9B, the plurality of fins 930 may be affixed to the exterior pipe 910 and extend to radially toward the interior pipe 920. It is further appreciated that the fins 930 may be affixed to both the exterior pipe 910 and the interior pipe 910 and extending therebetween. The fins 930 may be constructed of materials having a high thermal conductivity, as are known.

Fins as described may also be employed in embodiments having a pipe system not including both an interior or exterior pipe, such as substantially U-shaped pipe system as described with reference to FIG. 4. In these embodiments, the fins may be affixed to the interior surface of the pipe and extend radially inward, further improving geothermal heat transfer from the earth to the fluid pumped therethrough.

The fluid 440 is forced through the pump using the pump station 410. The fluid 440 is circulated through the pipe 422, the hot junction 320 of the thermoelectric generator 430, and the pump station 410 using the pump. Additional fluid may be added to the pipe system 420 either continuously or when needed by the system to account for any loss of fluid during operation of the pipe system and pump station. However, one of ordinary skill in the art will recognize that other methods of bringing the heated fluid to or near the surface may be employed.

The fluid 440 within the pipe 422 is heated by the earth as it descends from the pump station 410 towards the bottom of the hole 416. The fluid 440 may be heated to approach the temperature of the earth in the hole 416. In an exemplary embodiment, the fluid 440 may be heated in excess of 200 degrees Fahrenheit. After the fluid 440 reaches the lowest point of the pipe 422, the heated fluid then ascends out of the hole 416 and into the input of the hot junction 320 of the thermoelectric generator 430.

The heated fluid in the pipes 422 may be the high temperature source and is thermally coupled to the hot junction 320 of the thermoelectric generator 430. The fluid exits the inner bore of the pipe 422 and enters the input of the hot junction 320 of the thermoelectric generator 430. The fluid 440 then may exit through the output 330 of the hot junction 320 of the thermoelectric generator 430 through the inner bore of the pipe 422. The fluid 440 continues to the pump station 410 to close the pumping cycle of the fluid. The pump station may include any pump that is operable to pump the fluid 440 through the pipe system 420 and the thermoelectric generator 430 at an appropriate volumetric rate. Furthermore, the thermoelectric generation system may operate as either a closed system or an open system.

The fluid 440 may include any fluid that is capable of being heated by the earth and capable of retaining a substantial portion of the heat for delivery to the hot junction of the thermoelectric generator. In an exemplary embodiment, the fluid is water, however, other fluids may be employed to reduce corrosion and to allow heating well above the boiling point of water.

The thermoelectric generator 430 may be located in the body of water 402 and in communication with the pipe system 420. The body of water 402 is used as the low temperature source for the cold junction 360 of the thermoelectric generator. In the exemplary embodiment of FIG. 4, the thermoelectric generator 430 is located beneath the thermocline of the body of water 402 so that the cold junction 360 may access the low temperature water below the thermocline. In an exemplary embodiment, the thermoelectric generator 430 may be located in a current stream in the body of water 402 to access a flow of the water. The body of water 402 provides the low temperature source for cold junction 360 of the thermoelectric generator 430. The cold junction 360 may be outwardly exposed to the water in the body of water 402. The cold junction 360 may be sufficiently protected to prevent corrosion. The water in the body of water 402 also may be channeled into the cold junction 360 of the thermoelectric generator. The cold junction 360 may include an input for receiving the water and an output for exiting the cold water. The water may flow through the cold junction 360 to provide the low temperature source to the cold junction 360 of the thermoelectric generator.

In an exemplary embodiment, the high temperature source may be between 100 degrees Fahrenheit and 600 degrees Fahrenheit and the low temperature source may be between approximately 32 and 130 degrees Fahrenheit. One of ordinary skill in the art will appreciate that the high temperature source and low temperature source are not limited to these temperature ranges but may be any appropriate temperature ranges. The temperature gradient ($\Delta T$) between the hot junction and the cold junction may be between 470 and 68 degrees in the exemplary embodiment. One of ordinary skill in the art will appreciate that the temperature gradient is not limited to this range but may be any temperature gradient.

The thermoelectric generator 430 creates a voltage potential across the hot junction 320 and the cold junction 360 of the thermoelectric generator. The use of the heat from the earth to control the temperature of the hot junction 320 and the coldness of the water to control the temperature of the cold junction 360 maximizes the temperature gradient and produces significant amounts of electrical power. The electrical power may be created as a direct current. The direct current may be transformed to an alternating current. A three-phase current may also be created. The electricity generated from the thermoelectric generator 430 may be transmitted through power lines 450 to any destination. In an exemplary embodiment, existing power transfer facilities and power conduction lines 450 may provide power to any current or newly created electrical grid network.

In another embodiment, the high temperature source may be used in conjunction with a steam powered generator. Fluid may be pumped through a pipe system into the earth's crust. The fluid may then be heated by the earth's crust and pumped to the surface. Using the high temperature source to heat the fluid may minimize the power required to operate a steam powered generator by preheating the water to the steam plants. The cost of heating the fluid to its boiling point, therefore, will be significantly reduced at hydrocarbon powered or other types of electrical plants if the fluid can be brought to a higher temperature as a result of heating within the earth's crust. For example, if the fluid is water, the high temperature source may heat the water to or near its boiling point. The water then could be converted to steam for use in the steam power generator. If the fluid is a fluid such as oil that has a boiling point greater than water, the fluid can be heated above 212 degrees Fahrenheit such that it can transfer heat through a heat exchanger to water in the steam powered generator to be converted to steam without the need of any or very little fossil fuels or other energy sources. The steam powered generator may be used in conjunction with the thermoelectric generation system or completely separate therefrom.

In some embodiments, the invention may include alternative power generating means, instead of a thermoelectric generator, as described above. For example, the alternative power generating means may include Stirling engines, Rankine engines, Matteran energy cycle engines, flash power plants, dry steam power plants, binary power plants, flash/binary combined cycles, and the like. By way of illustration, Sterling engines are described as an illustrative embodiment; though it is appreciated that the power generation system may include other power generation means, such as, Rankine engines, Matteran energy cycle engines, flash power plants, dry steam power plants, binary power plants, flash/binary combined cycles, and the like.

A Stirling engine is a heat engine that is vastly different from typical internal combustion engines, and can be much more efficient than a gasoline or diesel engine. Today, however, Stirling engine use is typically limited to specialized applications, such as in submarines or as auxiliary power generators for yachts, where quiet operation is important. A Stirling engine uses the Stirling cycle, which is unlike the cycles used in internal combustion engines, operating under the principles of the Carnot cycle. Example Stirling engines may include an alpha-type or beta-type Stirling engine using a single displacer piston, or a gamma-type Stirling engine using at least a two-piston configuration. The gasses used inside a Stirling engine do not escape the engine. There are no exhaust valves that vent high-pressure gasses, as in a gasoline or diesel engine, and combustion does not occur. Because of this, Stirling engines are very quiet.

An exemplary embodiment of a Stirling engine may include a cylindrical hot chamber with a piston, a cylindrical cold chamber with a piston, a gas, and a connecting pipe. A high temperature source may be applied or thermally coupled to the hot chamber to increase the temperature of the gas within the hot chamber. Heat from the high temperature source may be transferred to the gas through conduction, convection, radiation or any other means. A low temperature source may be applied or thermally coupled to the cold chamber to decrease the temperature of the gas within the cold chamber. Heat from the gas may be extracted by the cold temperature source through conduction, convection, radiation or any other means.

As known by those of ordinary skill in the art, the Stirling engine operates by pressurizing and depressurizing the gas through the application of a high temperature source to the hot chamber and application of a low temperature source to the cold chamber. The efficiency and power generated by the Stirling engine also may be increased through the use of an increased high temperature source and a decreased low temperature source to create a substantial temperature gradient across the hot chamber and the cold chamber. The temperature gradient across the hot and cold chambers will increase the pressure distribution across the engine which causes the pistons, to more actively move. Thus, the greater the temperature difference between the hot and cold heat exchangers, the more efficient the Stirling engine operates. The pistons, may be connected to a shaft such that the movement of the pistons causes the shaft to rotate. An electric generator may be attached to the shaft to convert the mechanical energy of the rotating shaft to electricity.

Figure 10:
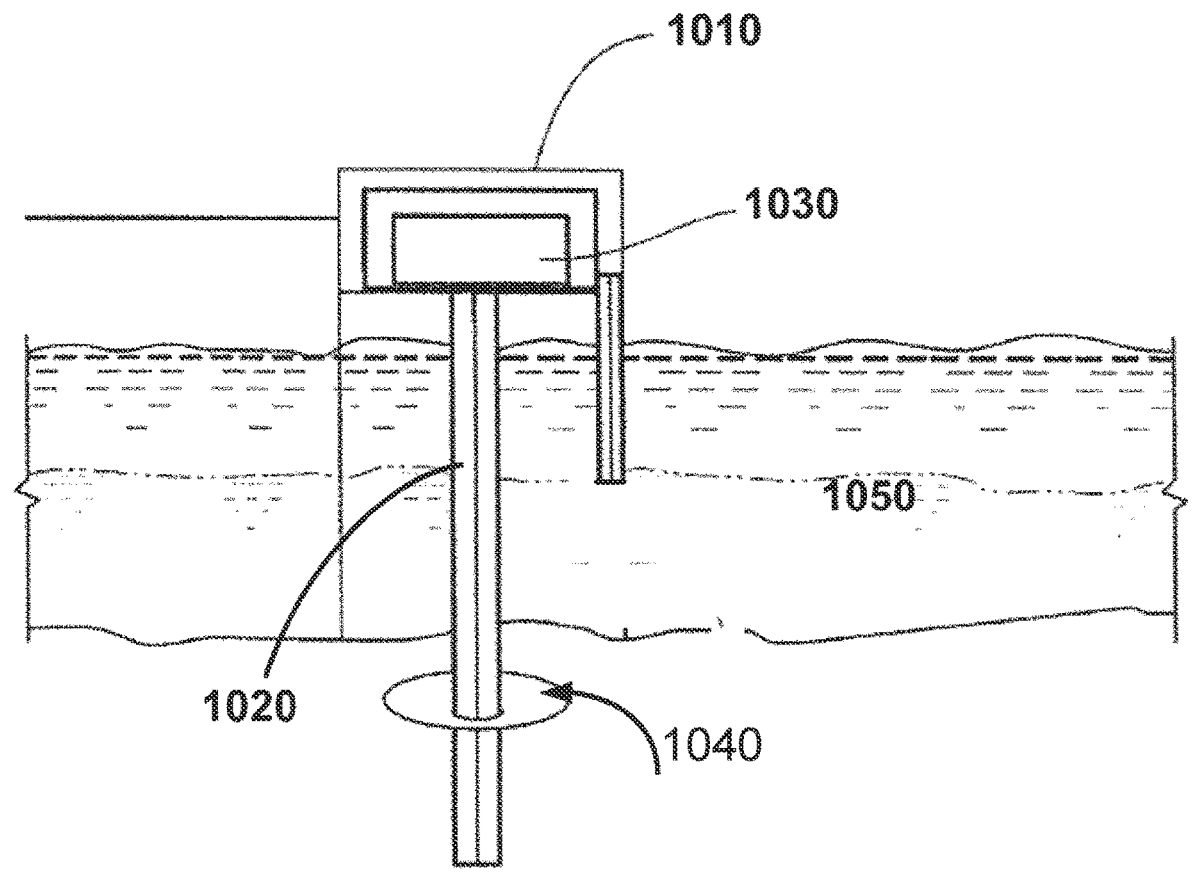
FIG. 10 is an illustration of a thermoelectric generation system according to an exemplary embodiment.

An example embodiment of a system employing a Stirling engine is illustrated in FIG. 10. The Stirling engine generation system may include a pump station 1010, a Stirling engine generator 1030 (which as referred to herein includes both a Stirling engine and an electrical generator for the generation of electricity), a pipe system 1020 placed within a deep well or other hole 1040 in the earth's crust, and a heat transfer medium flowing through the pipe system 1020, in much the same manner as described with reference to FIGS. 4-9 and the embodiments employing a thermoelectric generator. In one example embodiment, the Stirling engine generation system may be positioned in or proximate to a body of water 1050. In other example embodiments, the Stirling engine generation system may be geographically separated from the body of water 1050, and optionally be in thermal communication therewith, for example, by a secondary pipe system, as illustrated in FIG. 7.

The pipe system 1020 interfaces with a hot junction (also referred to as a hot heat exchanger) of the Stirling engine generator, so as to provide thermal communication between the heat transfer medium within the pipe system 1020 and the hot chamber (also referred to herein as the "hot junction" or the "hot heat exchanger"). In a manner similar to that described above with reference to FIGS. 4-8, the heat transfer medium (for example a fluid such as water) is pumped from the pump station 1010 down the pipe system 1020 for heating. The transfer medium within the pipe system 1020 is heated by the earth as it descends from the pump station towards the bottom of the hole 1040. The heat transfer medium may be heated to approach the temperature of the earth in the hole 1040. In an exemplary embodiment, the heat transfer medium may be heated in excess of 200 degrees Fahrenheit. After reaching the lowest point of the pipe system 1020, the heated medium then ascends out of the hole 1040 and toward the hot chamber of the Stirling engine generator 1030.

The heated medium within the pipes provides a high temperature source for thermally interfacing with the hot heat exchanger of the Stirling engine generator 1030. Accordingly, the heat available within the deep well or hole 1040 provides a very high temperature source in thermal communication with the Stirling engine for heating the gas therein. The heat transfer medium may include any fluid that is capable of being heated by the earth and capable of retaining a substantial portion of the heat for delivery to the hot chamber of the Stirling engine generator 1030. In an exemplary embodiment, the fluid is water, however, other fluids may be employed to reduce corrosion and to allow heating well above the boiling point of water.

The cold heat exchanger or the cold chamber (also referred to herein as the "cold junction" or the "cold heat exchanger") of the Stirling engine generator may be in thermal communication with a low temperature source, such as a body of water as further described above with reference to FIGS. 4-8. In an exemplary embodiment of the Stirling engine generator, the cold chamber of the generator is in thermal communication with the body of water at a point beneath the thermocline of the body of water so that the cold chamber may access the low temperature water below the thermocline or cool water from the thermocline may be pumped to the surface to provide a lower temperature heat sink.

In an exemplary embodiment, the high temperature source may be between 100 degrees Fahrenheit and 600 degrees Fahrenheit and the low temperature source may be approximately 32 and 130 degrees Fahrenheit. It is appreciated, however, that the high temperature source and low temperature source are not limited to these temperature ranges but may be any appropriate temperature ranges. The temperature gradient (ΔT) between the hot junction and the cold junction may be between approximately 470 degrees and approximately 68 degrees in an exemplary embodiment. Again, it is appreciated, however, that the temperature gradient is not limited to this range but may be any temperature gradient. Thus, the use of the heat energy available from within the earth's crust to increase the temperature at the hot heat exchanger of the Stirling engine generator and the cold-ness of the water to cool the temperature of the cold heat exchanger, creating a more powerful heat sink for dissipating heat from the engine, maximizes the temperature gradient and produces significant amounts of electrical power. The electrical power may be created as a direct current. The direct current may be transformed to an alternating current. A three-phase current may also be created. The electricity generated from the Stirling engine generator may be transmitted through power lines to any destination. In an exemplary embodiment, existing power transfer facilities and power conduction lines may provide power to any current or newly created electrical grid network.

As stated previously, other power generation means that gain advantage with larger temperature differentials may be used in concert with the heat energy transferred from the earth's crust by the systems and methods described herein. In one example, a Rankine engine may be used in much the same manner as either the thermoelectric generator or the Stirling engine, cycling the heat transfer medium from the pump station to the bottom of the well or hole, then through the Rankine engine and back, while also leveraging a low temperature source such as a body of water.

Figure 11:
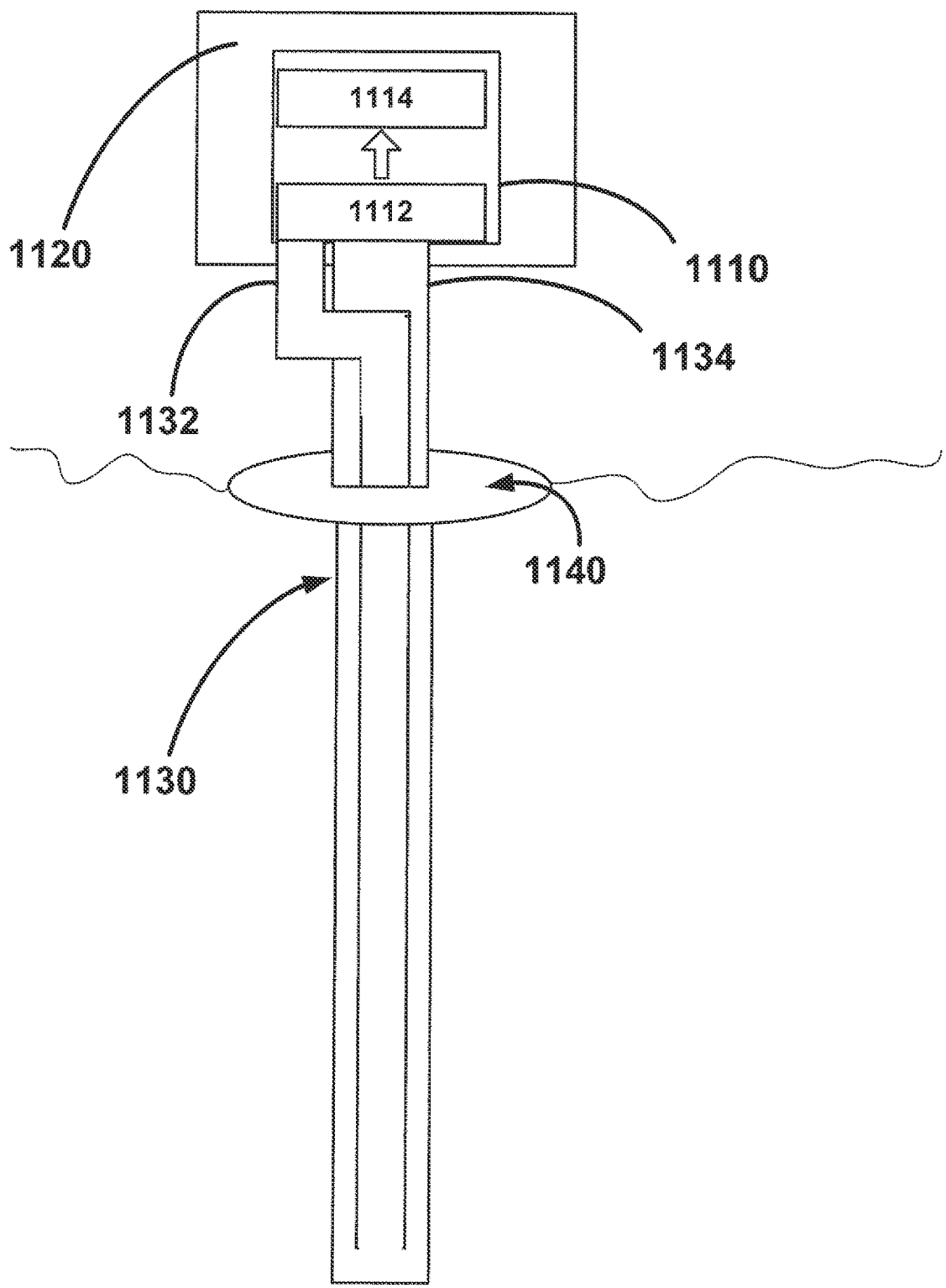
FIG. 11 is an illustration of a thermoelectric generation system according to an exemplary embodiment.

FIG. 11 illustrates another example embodiment, including a power generating means 1110, which may include a turbine 1112 and generator 1114, a pump station 1120, and a pipe system 1130 extending into a deep well or hole 1140 within the earth's crust, as described in detail with reference to FIGS. 4-10. As illustrated in FIG. 11, the pipe system may include an inner pipe 1132 and an exterior pipe 1134, as is described more fully with reference to FIGS. 6 and 9. However, it is appreciated that any of these exemplary embodiments may employ other pipe configurations, such as, for example, a substantially U-shaped pipe.

It is further appreciated that the pipe system 1130 may configured as a heat pipe or a thermosiphon, as are known. A heat pipe is a heat transfer mechanism operable to transport significant quantities of heat with a small temperature gradients. Inside a heat pipe, at or near the high temperature source, the heat transfer fluid therein vaporizes and naturally flows and condenses on or near a lower temperature interface such as at the power generating means 1110. After condensing, the liquid falls or is moved by capillary action back to the high temperature source to evaporate again and repeat the cycle. Accordingly, in embodiments where the pipe system 1130 is configured as a heat pipe, heat from the bottom of a hole 1140 can quickly be transferred to the power generating means 1110, and the heat extracted and used to power the turbine 1112. It is further appreciated that while the heat pipe and thermosiphon are described in reference to FIG. 11, any embodiments may employ heat pipe technology to configure some or all of the pipe systems used therein.

The power generating means 1110 may include a Sumrall energy cycle plant, a Matteran energy cycle plant, a flash power plant, a dry steam power plant, a binary power plant, a flash/binary combined cycle power plant, and the like, each of which are more fully described with reference to FIG. 11.

In an example embodiment using a Sumrall energy cycle plant as the power generating means 1110, the heat transfer medium may be one that is liquid at normal room temperatures, but has a lower boiling point than water, allowing it to vaporize at lower temperatures. In the Sumrall energy cycle, the low boiling point medium is delivered directly down the pipe system 1130, rather than as a secondary fluid interfacing through a heat exchanger with the primary heat transfer medium delivered down the pipe, as in a binary cycle power plant as is known. Example media for use in the Sumrall energy cycle may include isobutane, cyclopentane, or other materials vaporizing below 100 degrees Celsius. Accordingly, a medium with a lower boiling point has a lower heat of vaporization and thus can be vaporized directly by the heat reached within the pipe system 1130 at the bottom of the hole or well 1140 and the vapor transported directly to the turbine 1112 in the power generation means 1100 for driving a generator 1114 to produce electrical energy. After being delivered through the turbine, the low boiling point medium is then re-condensed to a liquid and delivered back down the well 1140 through the pipe system 1130 for the next vaporization cycle. This example embodiment, which may be referred to as a Sumrall energy cycle plant, may be entirely or substantially closed loop in design, and may not require a low temperature source as in the other thermoelectric generators, heat engines, and the like. Furthermore, this example embodiment may not require the use of a pump station, as the heat vapor can rise through the pipe system naturally and be gravity fed to the high temperature source. It is further appreciated that a low boiling point fluid may be employed in any of the other configurations, providing a gaseous interface at the hot junction rather than a fluid one.

Using a low flashpoint fluid such as isobutane or cyclopentane in a turbine can result in better performance of the turbine as compared to using water or steam. Low flashpoint fluids can be used at lower pressures and lower velocity (as compared to water or steam), which result in less wear to blades and metal parts of the turbines and other equipment. Using low flashpoint fluids allows a higher flow rate, which allows use of a larger diameter turbine. This will also reduce the speed of the working fluid and can result in less wear and damage to turbine components. Also, low flashpoint fluids are less likely to contain entrained liquid which can impinge on turbine blades, casings, and other components, and damage the turbine.

In another example embodiment, the power generating means 1110 may be a Matteran energy cycle power plant. The Matteran energy cycle is generally a closed loop energy cycle that does not require the use of fluid feed pumps, and requires only low temperature heat source as a result of its use of a refrigerant instead of water as the heat transfer medium and a condensing mechanism (not shown) to recollect vapor, a heat exchanger (not shown) to heat the condensed material prior to delivery to the high temperature source for heating, connected through a series of controllable valves. Accordingly, with reference to FIG. 11, the power generating means 1110 may include a Matteran energy cycle plant. Thus, the fluid transfer medium in this example embodiment is a refrigerant as is known. Further, though not shown, the Matteran energy cycle plant may include at least one condenser in communication with the fluid return pipe 1134 to condense any remaining vapor to its liquid state. Further, though also not shown, the Matteran energy cycle plant may include at least one heat exchanger in communication with the fluid return pipe 1134 and downstream the previously described heat exchanger. Further, a valve system as is known may selectably control the fluid from the turbine 1112 through the condenser and through the heat exchanger prior to delivery to the bottom of the pipe system 1130 and the bottom of the hole 1140 for heating. After heating, the fluid, which may be substantially vaporized, may be delivered to the turbine 1112 of the power generating means 1110 for causing a rotational force therein and transferring to a generator 1114, as is known. After being delivered through the turbine 1112, utilized heat transfer medium would again be delivered down the fluid return pipe 1134 for subsequent cycles of condensing, heating by the heat exchanger, heating by the high temperature source, and redelivery to the power generating means 1110.

In yet other embodiments, a dry steam power plant or a flash cycle power plant may be employed as the power generating means 1110. In the dry cycle power plant embodiment steam is delivered from within the well (and in one embodiment is an open loop configuration delivering steam existing within the earth's crust) to a turbine 1112 for power generation. In the flash steam power plant, heated water is delivered from within the well (which may include a closed loop configuration as described above with reference to FIGS. 4-10 or an open loop configuration) to an additional flash tank (not shown) for creating steam prior to deliver to the turbine 1112. Similarly, a binary power plant or a combination flash/binary combined cycle plant, may employ a secondary working fluid in thermal communication with the pipe system 1130, which is then vaporized to drive a turbine 1112 and generator 1114. Heat may be transferred from a primary medium being pumped to and from the bottom of the well 1140 to the secondary working fluid by way of a heat exchanger or series of heat exchangers, as are known. The use of an additional working fluid allows having a fluid with different qualities interfacing with the turbine 1112 than is being pumped down the pipe system 1130 to the bottom of the well.

It is appreciated that where the term "pump station" is used describing these example embodiments, the "pump station" need not include an actual pump, as is known, or pumping capabilities. Accordingly, the "pump station" as used herein may simply refer to the mechanism operable to deliver the heat transfer medium through the pipe systems to one or both of the high temperature source and the low temperature source, and return to the power generation means, such as the thermoelectric generator, the example heat engines, the example turbine generators, and the like. For example, while any pump means as are known may be contemplated in some example embodiments, other example embodiments may be gravity fed, siphon-based, displacement-based, and the like.

Geo-thermal generation systems encounter obstacles to efficient or cost-effective power generation. For example, about 40% of all geo-thermal wells drilled are non-productive, meaning they do not or cannot sustain an economical system for several reasons, including, but not limited to: insufficient heat resources, insufficient thermal conductivity, insufficient geo-pressure to bring hot brine to the surface, and others. Furthermore, brine, which is a heat carrier in geothermal formations can pose significant environmental and operational concerns. In traditional geo-thermal processes, the hot brine is pumped out of the ground from a production well, the heat is extracted above ground, and the brine is pumped back into the ground. Typical systems remove about 15-20% of the heat from the brine, and the brine is re-introduced into the geo-thermal formation in an injection well at a significant distance from the production well, for example, 1-2 kilometers or more. Because heat has been removed from the brine, the saturation conditions of the brine are changed, and precipitation of brine components (scaling) on pipe, pump, and heat exchange surfaces can occur. The precipitation of brine can plug piping, reduce heat transfer abilities, increase pumping power requirements, and cause pipe bursting. In order to prevent precipitation of the brine, significant amounts of water have to be added back into the brine. The water requirement can be as high as 1,000 acre-feet of water per MW of power produced. Thus, a 50 MW geothermal plant may use 16.3 billion gallons of fresh water per year.

Additionally, brine can contain caustic and toxic components, including heavy metals such as cadmium, arsenic, selenium, and toxic gasses such as hydrogen sulfide ($H_2S$) the like. Moving brine to the surface can result in the undesirable exposure to and release of these components into the environment. Further, brine is highly corrosive, and the steps must be taken to protect against corrosion of the piping systems which are exposed to the brine.

Embodiments of the current disclosure overcome and/or minimize the problems of conventional geo-thermal power production. Embodiments described herein minimize the amount of piping and equipment which processes or is in contact with brine. Embodiments described herein do not pump brine to the surface, but exchange heat in-ground, in the geo-thermal formation. This eliminates the need for huge amounts of make-up water or fresh water. Components of the brine which are hazardous are kept within the geothermal formation, rather than being moved to the surface. Further systems described below can utilize existing, used, or spent oil and gas wells which may not have sufficient geo-pressure to move the brine to the surface.

The current disclosure relates to geo-thermal power systems which utilize an in-ground heat exchanger having a primary heat transfer fluid therein, an above ground heat exchanger in which the primary heat transfer fluid gives up its heat to a secondary heat transfer fluid, and a generating portion which utilizes the secondary heat transfer fluid as the working fluid. The system can advantageously use an organic Rankine cycle, where an organic liquid (the secondary heat exchange fluid) having a relatively low boiling point such as isobutene, isopentane, cyclopentane, etc., which will undergo a phase change from liquid to vapor in a heat exchanger and then the vapor passes through the turbine and is re-condensed and re-circulated.

Figure 12A:
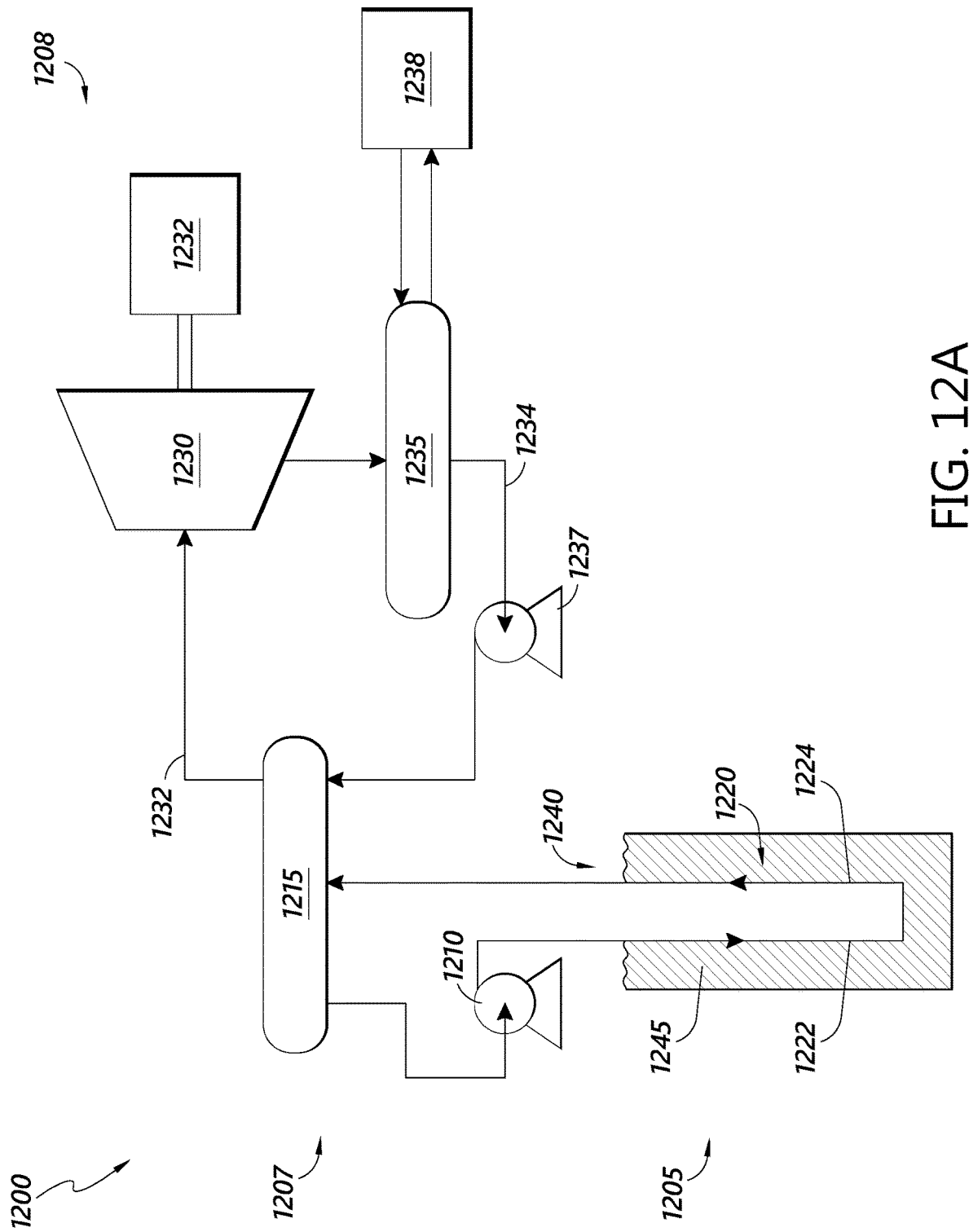
FIG. 12A is a system diagram of an embodiment of a geothermal energy production system.

FIG. 12A depicts an exemplary embodiment of a system for extracting heat from a geothermal feature. A generation system 1200 comprises a primary heat exchanger portion 1205, a secondary heat exchanger portion 1207, and a generating portion 1208.

The primary heat exchanger portion 1205 includes a hole or well 1240 drilled into a geothermal formation 1245 and a primary heat exchanger 1220. The well 1240 can be a newly drilled well. The geothermal formation 1245 can have a source of geothermal energy and a heat carrier, such as a brine within the geothermal formation. In some embodiments, the well 1240 can be a dry well, an expended oil or gas well, or an unused well. The primary heat exchanger 1220 has a supply portion 1222 and a return portion 1224 which are inserted into or disposed within the well 1240 and in the geothermal formation 1245, and which are in communication with the secondary heat exchanger portion 1207. Portions of the supply portion 1222 and the return portion 1224 extend out of the well 1240 to connect to other components of the system 1200.

In some embodiments, the temperatures in the well can increase as depth increases. In some wells, temperature up to 3000 feet can decrease, that is, get colder. In some embodiments, the temperatures may increase below 300 feet, such that useful heat transfer from the geothermal formation 1245 can occur. In some embodiments, the geothermal features can have increasing temperatures from 3000 feet to 12,000 feet or deeper. Temperatures down hole of 600° F. or higher can be advantageous for operation of the system 1200. Heat exchange fluid temperatures exiting the return portion 1224 can advantageously be around 600° F. The primary heat exchanger 1220 can extend the along the full depth of the well or nearly the full depth of the well, and heat transfer can happen all along the depth of the well. In some embodiments, the heat exchanger can extend through only the portion of the well having in-ground temperatures high enough for efficient heat transfer.

The primary heat exchanger 1220 will be described in greater detail below. A pump 1210 is in fluid communication with the supply portion 1222 and the return portion 1224 and provides a motive force for circulating a primary heat transfer fluid through the supply portion 1222 and the return portion 1224. In some embodiments, the pump 1210 can generate a positive pressure to force the primary heat transfer fluid down the well 1240 within the geothermal formation 1245. In some embodiments, the pump 1210 can provide a negative pressure to draw the primary heat transfer fluid up out of the well via the return portion 1224. This can be advantageous, as the static head of the fluid in the supply portion 1222 can assist in moving the primary heat transfer fluid out of the well 1240.

The pump 1210 can be a centrifugal pump, a positive displacement pump, a source of pressurized air or an inert gas, or any other type of pump. The pump 1210 can be electrically, mechanically, or fluid driven. A person of skill in the art will understand that the pump 1210 can be any component capable of providing a motive force to circulate the primary heat transfer fluid into and out of the well 1240.

In some embodiments, the primary heat transfer fluid can be a fluid having a high heat capacity, such as water. In some embodiments, the primary heat transfer fluid can be a high temperature vapor/liquid phase fluid or an organic heat transfer fluid. An ultrahigh-temperature heat transfer fluid, such as Therminol®, can be advantageously used. In some embodiments, the primary heat transfer fluid can be a mixture of Therminol and nano-powder, such as nano-powder magnesium. Using a high temperature heat transfer fluid such as Therminol® can improve the heat absorption from the geothermal formation 1245 and reduce corrosion in the primary heat exchanger 1220 and the secondary heat exchanger 1215, as compared with using water and steam. It is desirable that the heat transfer fluid be capable of handling the high heat associated with geothermal power generation. The thermal conductivity of the primary heat transfer fluid can be increased by addition of nano-powders or similar components. The primary heat transfer fluid can be a nanofluid. A nanofluid can be a fluid which has nanometer-sized particles of metal, such as magnesium, or ceramic or other particles having an average size of 1-100 nm which improve the heat transfer capability of the fluid. In some embodiments, nano-powder magnesium has a heat capacity of 1047 J/kg-K. The heat capacity of the primary heat transfer fluid can be increased by addition of other additives, such as lithium. In some embodiments, the primary heat exchanger 1220 can be kept pressurized to ensure the primary heat transfer fluid is maintained as a liquid to provide sufficient heat transfer capability and pumpability. In some embodiments, the primary heat transfer fluid can be other materials suitable for geothermal heat transfer such as eutectic salts, which can improve the efficiency of the system 1200.

Heat flow in the primary heat exchanger 1220 occurs as the primary heat transfer fluid is pumped down into the well 1240, or is otherwise moved via a motive force into the well 1240. The heat from the geothermal formation 1245 is carried by the heat carrier or brine to the supply portion 1222. The heat from the heat carrier or brine is transferred through a wall of the supply portion 1222 and into the primary heat transfer fluid. The heat transfer fluid absorbs heat and is moved via motive force, such as a pump, to the secondary heat exchanger portion 1207, where the primary heat transfer fluid gives up its heat to a secondary heat transfer fluid. The cooler primary heat transfer fluid is re-circulated down into the well to repeat the cycle.

The primary heat transfer fluid returning to the well is already heated above ambient, because it does not give up all its heat to the secondary heat transfer fluid. In a typical geothermal operation, only about 15-25% of the heat (from the brine or steam) is extracted from the heat source and the remainder of the brine or steam is reinjected far from the point of extraction and therefore is of no further use to the process. The current application, however, is designed to allow this residual heat (between 75-85% of the original heat) to be reinjected back into the same well from which it was extracted. In this way, the primary fluid can be reheated to optimal temperature with less heat input from the geothermal formation to the desired temperature for the optimal thermal operation of the system. This results in less wasted heat in the system 1200, and improves efficiency of operation It will be appreciated, however, that the overall surface area of the primary heat exchanger 1220 can be increased by increasing the pipe diameters as much as possible. In some embodiments, such as, for example, when using an existing well, the diameter of the existing well 1240 may only allow for a heat exchanger that has a smaller diameter than the existing casing. However, by employing of an under reamer the open hole section of the well, that is, sections of the well which do not have a casing, can be increased in diameter (beyond that of the existing casing) and an expandable casing or support collars as described elsewhere herein may be inserted into the open hole section of the well, thus providing a larger diameter primary heat exchanger 1220.

The secondary heat exchanger portion 1207 comprises a secondary heat exchanger 1215, a hot fluid line 1232, and a cold fluid line 1234. In some embodiments, the secondary heat exchanger 1215 can be a shell and tube type heat exchanger. In some embodiments, the supply portion 1222 and the return portion 1224 are in fluid communication with a tube portion the secondary heat exchanger 1215. The hot fluid line 1237 and the cold fluid line 1234 are in fluid communication with a shell portion the secondary heat exchanger 1215. The primary heat transfer fluid flows through the tube portion of the secondary heat exchanger 1215 and gives up its heat to a secondary heat transfer fluid in the secondary heat exchanger 1215, which flows on the shell side of the secondary heat exchanger 1215. The secondary heat transfer fluid is vaporized by the heat of the primary heat transfer fluid, and the vaporized secondary heat transfer fluid flows into the generator portion 1208.

The secondary heat transfer fluid is circulated through the hot fluid line 1232 and the cold fluid line 1234 via a feed pump 1237. The feed pump 1237 can be any type of pump capable to deliver a motive force to circulate the secondary heat transfer fluid into the secondary heat exchanger 1215, and can be similar to pumps described elsewhere herein.

In some embodiments the primary and secondary heat transfer fluids do not mix and are isolated from one another in the secondary heat exchanger 1215.

The secondary heat transfer fluid can be a fluid which vaporizes at the temperatures achieved within the secondary heat exchanger 1215. In some embodiments, the secondary heat transfer fluid can be water. In some embodiments, the secondary heat transfer fluid can advantageously be an organic compound having a flashpoint lower than that of water. In some embodiments, the secondary heat transfer fluid can advantageously be isobutane or cyclopentane.

The generator portion 1208 includes a turbine 1230, a generator 1232 and a condenser 1235. The vaporized secondary heat transfer fluid impinges blades of the turbine 1230, which spins a turbine shaft which is mechanically connected to the generator 1232. As the turbine 1230 spins, the generator 1232 generates electricity. The turbine 1230 can advantageously be part of an organic Rankine cycle.

The condenser 1235 operates to condense the secondary heat transfer fluid using a coolant supplied from a cooler 1238. The cooler 1238 can include one or more water or air cooled towers as are known in the art. In some embodiments, the cooler 1238 can be a large heat sink, such as a body of water, and coolant can be pumped via a pump (not shown) or naturally circulated through the condenser 1235, similar to heat sinks described elsewhere herein. The condensed secondary heat transfer fluid is circulated into the secondary heat exchanger 1215 via the feed pump 1237, where it is heated and vaporized again.

The heat exchangers 1215 and 1235 are described herein as shell-and-tube type heat exchangers. However, one of skill in the art will understand, guided by this disclosure, that any type of heat exchanger can be used. Additionally, a person of skill in the art will understand that the fluids flowing in the shell and tube sides of the heat exchangers can be changed without departing from the scope of this disclosure.

In some embodiments, the generation system 1200 may not include a secondary heat exchanger 1215. In this case, the primary heat transfer fluid is heated in the well 1240, circulates to the turbine 1230 as the working fluid for the turbine 1230, and is then condensed in the condenser 1235 to return to the well 1240.

Figure 12B:
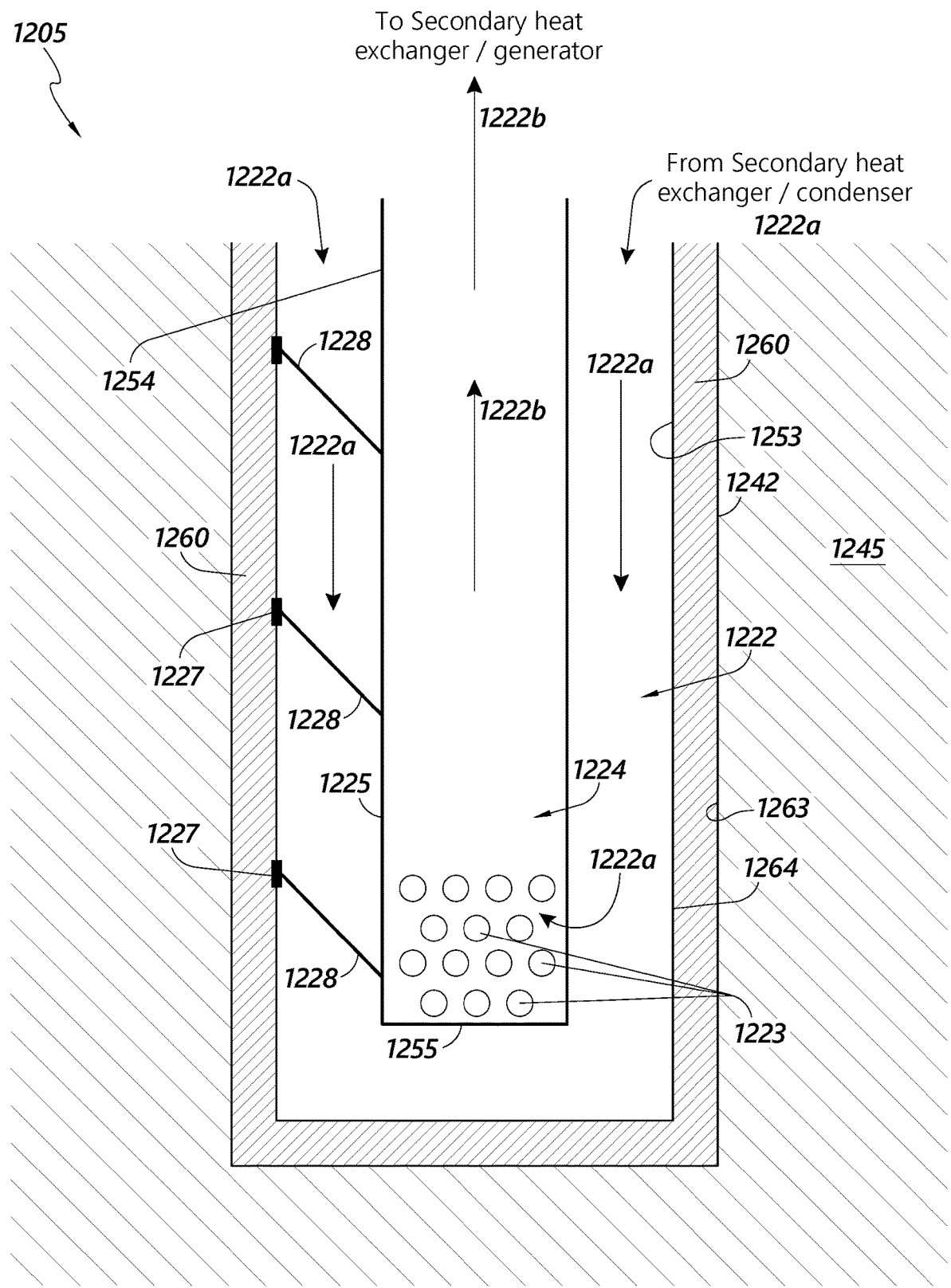
FIG. 12B is a cutaway view of an embodiment of a heat exchanger within a well.

FIG. 12B depicts a close-up cross-sectional view of a portion of the primary heat exchanger 1220 within the well 1240. The well 1240 can be a bore formed within the geothermal formation and can be similar to that described elsewhere herein. Within the geothermal formation 1245, a liquid, such as a brine, can be present. The brine is heated within the geothermal formation 1245 by geological effects. The heated brine flows within geothermal formation 1245 and within the well 1240 and supplies heat to the heat exchanger 1220. It will be appreciated, that in hot/dry down hole conditions, such as where there is no brine) that heat may be transferred by the thermal conductivity of the surrounding rock and that a high temperature and highly thermally conductive material may be inserted between the exterior of the heat exchanger and the wall of the dry well to enhance thermal conductivity under hot/dry downhole conditions. In this case, the highly thermally conductive material can be the heat carrier to transfer heat from the hot rock to the primary heat exchanger 1220.

The primary heat exchanger 1220 comprises the supply portion 1222 and the return portion 1224. The supply portion 1222 is bounded by an outer shell 1264, which is in contact with the geothermal formation 1245, and by the return portion 1224. The outer shell 1264 comprises a plurality of casing units or segments which are connected to each other, end to end, using casing joints or casing couplers 1227. In this way, the outer shell 1264 can be as long as necessary to reach the depth of the geothermal formation 1245. The casing couplers 1227 connect one section of casing to another, and form the external boundary of the primary heat exchanger 1220.

The outer shell 1264 can be a casing in an expended or unused oil or gas well. In some embodiments, the outer shell 1264 can be provided or positioned within a drilled well which doesn't already have a casing. In the case where a pre-existing casing exists in a well, the primary heat exchanger 1220 can be formed by inserting the return portion 1224 within the casing and being sealed to prevent in-leakage of brine or out-leakage of primary heat transfer fluid. The return portion 1224 can be supported within the casing, or supply portion 1222 as described herein.

As noted above, brine is highly corrosive and susceptible to precipitation or scaling on the outer shell 1264 of the supply portion 1222. Scale material, such as iron silicate or barium sulfate can deposit or build-up on the well side surface of the outer shell 1264. Calcium carbonate might not scale on the outer shell 1264 because the heat transfer process in the well 1249 is isobaric. Scale build-up on the outer shell 1264 reduces the thermal conductivity of the outer shell 1264 which lowers the amount of heat transferred from the brine to the primary heat transfer fluid.

To prevent or minimize corrosion and scale build-up and to prolong the useful operational life of the primary heat exchanger, the materials of the outer shell 1264 can be carefully selected. For example, the outer shell can be formed out of stainless steel which is then clad with a corrosion resistant material, such as nickel alloy 625. The nickel alloy 625 resists corrosion and scaling, and maintains a high thermal conductivity of the outer shell 1264. Corrosion resistant materials can also be effective scale inhibitors, because the corrosion resistant materials resist formation of nucleation sites which are required for scale to begin forming.

Also, the outer surface of the outer shell 1264, which is in contact with the brine during operation, can be coated with a non-metallic material which is very smooth. A coating using a non-metal material, such as carbon or boron. This non-metal material can be applied via chemical vapor deposition (CVD) or vapor deposition alloying (VDA). The non-metal material prevents an ionic bonding site from forming, thus preventing scale formation.

A diamond-like carbon (DLC) coating can be advantageously applied to the outer surface of the outer shell 1264. A DLC is a class of amorphous carbon material that has significant amounts of $sp^3$ hybridized carbon atoms. One form of DLC, for example, tetrahedral amorphous carbon (ta-C) can be advantageously used. A 2 mm thick coating of ta-C can increase greatly the resistance of stainless steel (or lower or higher grades of steel) to abrasion, scaling, and other fouling. Other forms of DLC can also be advantageously used, such as forms having hydrogen, graphitic carbon, or metals can be used to reduce expenses and to impart other desirable properties. In some embodiments, carbon nitride, boron nitride, or other carbon- or boron-containing materials can be advantageous applied to the outer surface of the outer shell 1264 to prevent or minimize scaling and corrosion. A boron nitride coating (applied via CVD or VDA or similar method) can improve the operational lifetime of the primary heat exchanger 1220 by up ten times.

In some embodiments, the outer shell 1264 can be formed of or coated with highly thermally conductive ceramics, which resist scaling and corrosion from brine.

The return portion 1224 includes a return pipe 1254 that is concentrically disposed within the outer shell 1264 of the supply portion 1222. The flow velocity through the return portion 1254 will be higher than that in the supply portion 1222, because the return pipe 1254 has a smaller diameter than the outer shell 1264. The higher velocity in the return pipe 1254 can limit heat loss through the walls of the return pipe to the cooler portion of the primary heat transfer fluid in the supply portion 1222, as the primary heat transfer fluid moves up the return pipe 1254.

Additionally, to minimize the heat transfer between the supply portion 1222 to the return portion, through the return pipe 1254, a thermal insulation layer 1225 can be added to a surface of the return pipe 1254. This insulation layer can prevent, lower, and/or minimize unwanted heat transfer between the supply portion 1222 and the return portion 1224. The thermal insulation layer 1225 can be disposed on an inner surface, on an outer surface, or on both inner and outer surfaces of the return pipe 1254. In some embodiments, the thermal insulation layer can comprise a thermally resistant polymer, such as, for example, polybenzimidazole (PBI) or other similar material which has a high thermal resistance and low thermal conductivity.

In some embodiments, the return pipe 1254 can be vacuum insulated tubing. The vacuum insulated tubing is a dual walled tube having an evacuated space between the two walls. The evacuated space insulates the primary heat transfer fluid in the return pipe 1254 from the primary heat transfer fluid in the supply portion 1222. In some embodiments, the return pipe can be vacuum insulated tubing and additionally have an insulating coating thereon.

The return pipe 1254 is supported in place concentrically within the outer shell 1264 using one or more centralizers 1228. The centralizers are angled braces which extend from the inner surface of the outer shell 1264 at or near casing couplers 1227, and which are connected to the outer surface of the return pipe 1254. The centralizers 1228 are angled downward from the inner surface of the outer shell 1264 toward the outer surface of the return pipe 1254. Although FIG. 12B only depicts centralizers 1228 on one side of the primary heat exchanger 1224, they may extend around the circumference of the return pipe 1254 as will be described with regard to FIG. 12D. The centralizers 1228 act to support and maintain the return pipe 1254 centered within the outer shell 1264. The centralizers 1228 have a narrow profile to minimize hydraulic resistance to flow of the primary heat transfer fluid.

The return pipe 1254 is formed having one or more perforations 1223 therein. The one or more perforations 1223 provide a fluid path between the supply portion 1222 and the return portion 1224. In some embodiments, the return pipe 1254 is capped on a lower surface 1255, and the perforations are formed circumferentially proximate the bottom surface 1255 of the return pipe 1254. In some embodiments, the lower surface 1255 of the return pipe 1254 is not capped and heated primary heat transfer fluid flows up into the bottom of the return pipe 1254. In some embodiments, the return pipe 1254 includes perforations 1223 and is uncapped on the lower surface 1255.

The perforations 1223 can advantageously provide for an improvement in power requirements to circulate the first heat transfer fluid through the primary heat exchanger 1220 by decreasing the pressure on the bottom part of the shell as a result of pumping action.

The primary heat transfer fluid flows through the primary heat exchanger 1220 in the directions indicated by arrows 1222*a* and 1222*b*. To illustrate, cold, or relatively colder primary heat transfer fluid flows from the secondary heat exchanger 1215 down the well 1240 in the supply portion 1222, around the centralizers 1228, and to or near the bottom surface 1255 of the primary heat exchanger 1220, as shown by arrows 1222*a*. As the primary heat transfer fluid flows down the supply portion 1222, it picks up heat from the geothermal formation 1245 via the outer shell 1264 which is in thermal connection with the brine. The heat from the geothermal formation conducts through the outer shell 1264 and conducts and/or convects into the primary heat transfer fluid.

The hot, or relatively hotter primary heat transfer fluid flows through the perforations 1223 and into the return pipe 1254. The insulation on the return pipe minimizes heat transfer between the hot primary heat transfer fluid in the return pipe 1254 and the colder primary heat transfer fluid flowing down in the supply portion 1222. The hot primary heat transfer fluid then flows up the return pipe 1254 and to the secondary heat exchanger 1215 or, in some embodiments, to the turbine 1230.

The outer shell 1264 of the primary heat exchanger 1220 is supported in place within the well 1240. The outer shell 1264 generally has a smaller diameter than the well 1240, such that there is a gap between the outer shell 1264 and the inner wall 1263 of the well 1240.

In some used or dry oil and gas wells, portland cement or a high silica cement has been used to support a casing within the well 1240. In some embodiments described herein, the casing can form the outer shell 1264 of the primary heat exchanger 1220. Portland cement and other similar structural materials used in wells have a very low thermal conductivity. Portland cement, specifically, has a thermal conductivity of about 0.2 W/m·K. It has been found that using a support material having a low thermal conductivity greatly inhibits heat transfer in a well 1240. A structural material supporting the primary heat exchanger 1220 having such a low thermal conductivity would greatly inhibit heat transfer from the geothermal formation 1245 and the brine to the primary heat exchanger 1220. When using an existing well, such as a dry oil or gas well a portion of the existing well will already be cased and cemented with low conductivity cement until the casing is well within the geothermal formation so that geothermal brine cannot flow back up and into the much more-shallow fresh water aquifers. Below a certain depth, in some embodiments, the bottom ⅔ of the depth of the well) there is open hole, or non-cased, well, which is at a very high temperature within the geothermal formation 1245, and into which the heat exchanger may be inserted and where the heat transfer operations described herein can be performed. In one example, in a 12,000 ft. deep well, for the first three thousand feet, the subsurface temperature is cooler than the returning primary heat transfer fluid temperature (355° F.), therefore, the non-conductive cement prevents heat loss to the upper formation during its initial return cycle, and the only section which is not being taken advantage is the depth between 3,000 and 4,000 ft. (where the well is open to the geothermal formation).

It has been found that preferred thermal conductivity values for a structural material for supporting the primary heat exchanger 1220 within the well 1240 are around 15 W/m·K. A lower thermal conductivity than 15 W/m·K may not provide sufficient heat flux to efficiently use or to maximize use of the geothermal energy, and thermal conductivity values more than 15 W/m·K further increase heat flux, but to a point of diminishing returns for the cost of providing materials with the higher thermal conductivity. A cement or structural material having high thermal conductivity can advantageously be used to support a casing or the outer shell 1264 within the well 1240. In some embodiments, as will be described in greater detail below, the primary heat exchanger 1220 can be suspended or supported within the well 1240 without using a cement, concrete or grout.

To achieve a preferred or higher thermal conductivity in the support material a concrete or grout having thermally enhanced materials can be used. For example, a cement or grout can be thermally enhanced by adding metallic powders, such as aluminum, copper, magnetite, etc. Adding these materials to the cement or grout, which have high thermal conductivity values, increases the thermal conductivity of the resulting concrete. The cement or grout should have a neutral or close to neutral pH so as not to react with the added metallic powders. An alkaline or acidic grout could react with the added metallic materials and which could result in generation of gas, corrosion, and weakening of the cement or grout.

In some embodiments, such as depicted in FIG. 12B, the outer shell 1264 is supported in place by using a thermally enhanced cement 1260. The thermally enhanced cement 1260 can be disposed between the outer shell 1264 and the inner wall 1263 of the well 1240. The thermally enhanced cement 1260 improves heat transfer between the geothermal formation 1245 and the primary heat exchanger 1220, and supports the outer shell 1264 in place within the well 1240.

Figure 12C:
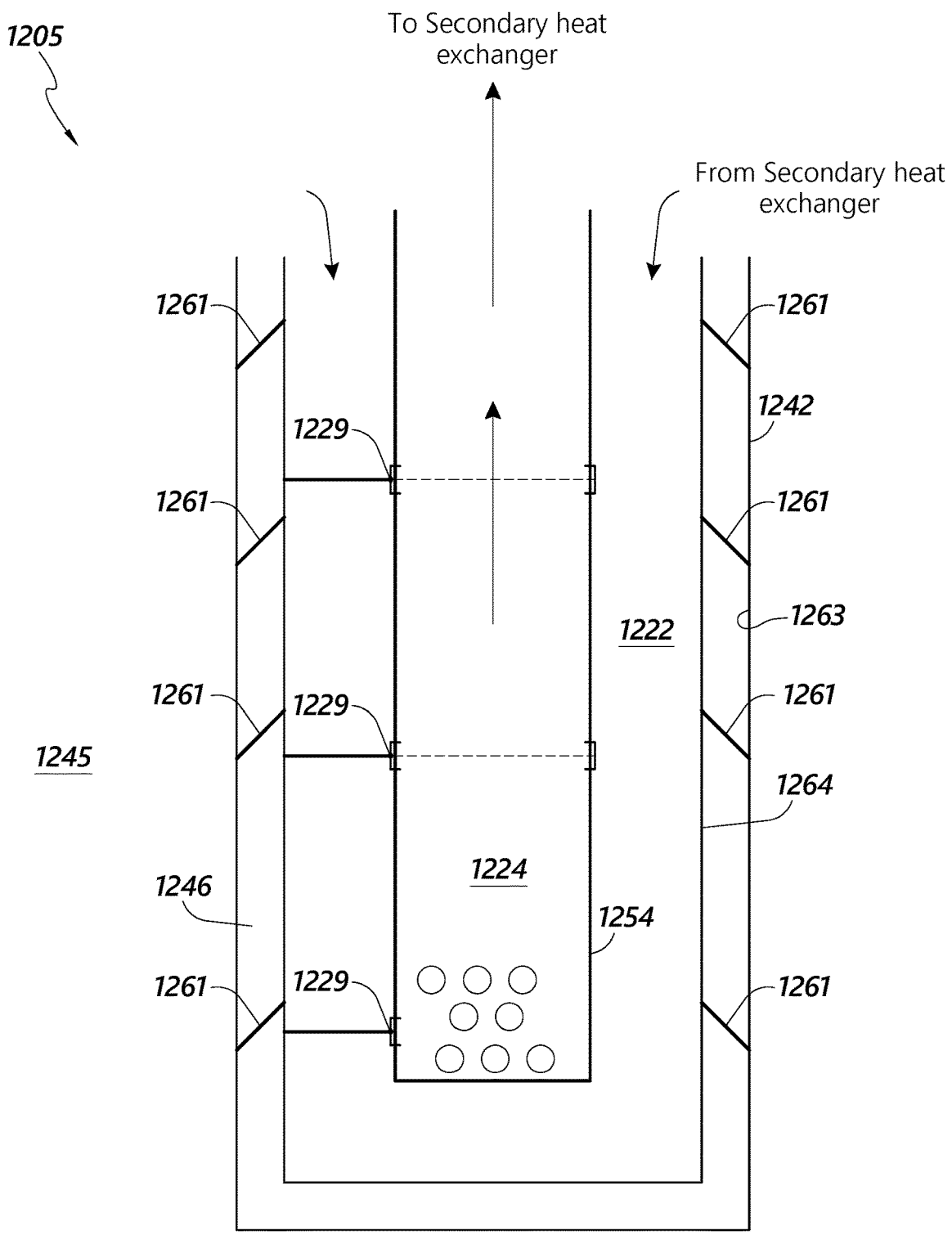
FIG. 12C is a cutaway view of an embodiment of a heat exchanger within a well.

FIG. 12C depicts an embodiment of the primary heat exchanger 1220 within the well 1240, where the outer shell 1264 is supported in place using a plurality of lateral support collars 1261. The lateral support collars 1261 extend from the inner wall 1263 of the well 1240 and contact the outer shell 1264. The lateral support collars 1261 can be spaced around the circumference of the outer shell 1264 and along a length of the outer shell 1264, and can extend at an angle downward from the outer shell 1264 toward the inner surface 1263 of the well 1240. Thus, using lateral support collars 1261 leaves a gap 1246 between the inner wall 1263 of the well 1240 and the outer shell 1264. The brine in the geothermal formation can flow around and through the gap 1246, and the brine can directly contact the outer shell 1264 of the primary heat exchanger 1220. This arrangement increases the heat transfer from the geothermal formation to the primary heat exchanger 1220. It will be understood that in some wells 1240 there may be fresh groundwater or other heat transfer medium other than brine in contact with the outer shell 1264.

Having the lateral support collars 1261 extend radially outward and down from the outer shell 1264 also provides support for, or limits movement of, the primary heat exchanger downward into the well 1240, or in the negative y-axis direction, but allows for movement upward, out of the well 1240, or in the positive y-axis direction. The lateral support collars 1261 can be attached to the outer surface of the outer shell 1264 at a junction which is moveable, or hinges. Before the heat exchanger 1220 is inserted into the well, the lateral support collars can be fastened at a first end to the outer shell of the heat exchanger via a biased and hinged, pivotable, or moveable, but not removable, junction. The other end of the lateral support collars can be folded down against the outer surface of the outer shell 1264, and can be held in place by a temporary connection or a degradable material. As the heat exchanger 1220 is inserted into the well 1240, the lateral support collars are flush or nearly flush with the outer surface of the outer shell 1264, and the heat exchanger 1220 can extend into the well 1240 without interference from the lateral support collars 1261. When the heat exchanger is in place in the well 1240, the temporary connection or degradable material can degrade. When the temporary connection degrades, a bias force in the junction at the first end of the lateral support collars 1261 causes the lateral support collars 1261 to extend to the position shown in FIG. 12C, and impinge the inner surface of the well 1240, supporting the heat exchanger 1220 within the well 1240.

In some embodiments, the temporary connection or degradable material is configured to degrade due to caustic conditions in the well 1240, or to thermally degrade due to the high temperatures down the well 1240, or both. Another degradation mechanism can be used as well.

This arrangement allows the primary heat exchanger 1220 to be easily removed upward out of the well 1240 if necessary, but prevents the primary heat exchanger 1220 from moving farther downward into the well 1240. In some embodiments, the primary heat exchanger 1220 can advantageously be suspended into the well 1240 from the land or water surface.

FIG. 12C also depicts the centralizers 1228 as horizontal braces which are connected to the return pipe 1254 at a junction 1229, and which are not connected to the outer shell 1264. This arrangement centers the return pipe 1254 within the shell 1264, and enables the return pipe 1254 to be removed from the shell 1264 (or the casing) or the well 1240 for maintenance, replacement, inspection, and the like. As the return pipe 1254 is removed from the casing, the centralizers 1228 are removed with the return pipe 1254. This arrangement also allows for insertion of the return pipe 1254 into the shell 1264 without having to navigate an array of structures connected to the shell 1264.

In some embodiments, the centralizers 1228 can be horizontally arranged and connected to both the return pipe 1254 and the shell 1264.

Although the angled centralizer 1228 arrangement in FIG. 12B is shown in an embodiment having thermally enhanced concrete 1260 and the horizontal centralizer 1228 arrangement in FIG. 12C is shown in an embodiment with support collars 1261, it is explicitly contemplated that horizontal centralizers 1228 can be used in heat exchangers supported by thermally enhanced concrete 1260 and that angled centralizers can be used in heat exchangers supported by support collars 1261.

Figure 12D:
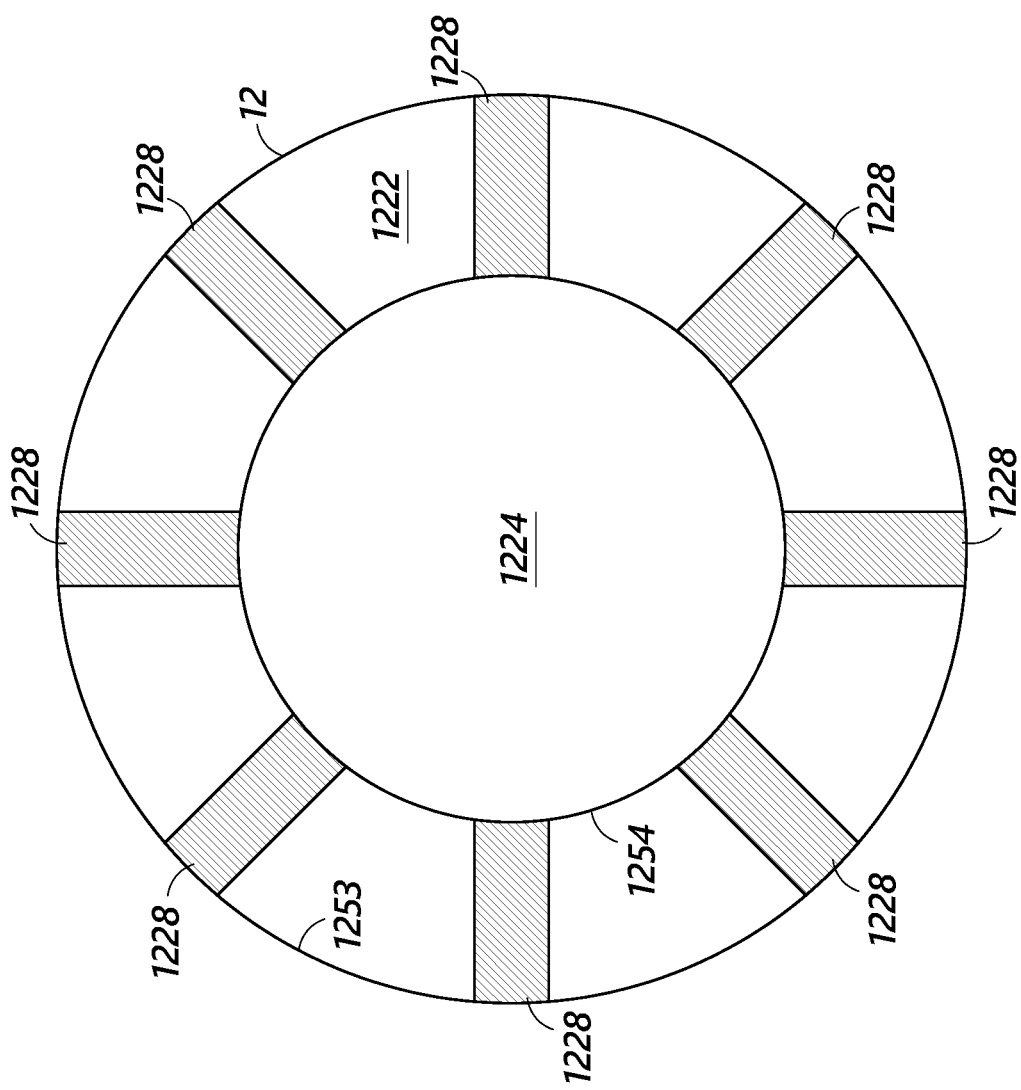
FIG. 12D is a top view of a portion of a heat exchanger.

FIG. 12D is a top view of the primary heat exchanger 1220 illustrating the arrangement of the centralizers 1228. As shown, the centralizers extend radially outward from the return pipe 1254 and toward the outer shell 1264, and are disposed circumferentially around the return pipe 1254. There is space between the centralizers 1228 to allow for the flow of primary heat transfer fluid. The view of centralizers 1228 shown in FIG. 12D can apply for either angled or horizontal centralizers 1228. FIG. 12D depicts that the centralizers 1228 will be narrow to minimize hydraulic resistance to flow of the first heat transfer fluid.

The systems and methods for generating electricity can also be adapted for heating and cooling of facilities, equipment, and the like. In heating and cooling applications, the system need not include a turbine or a generator, but can use heat exchangers and control systems to provide temperature control of a building, room, equipment and the like. Additionally using absorption or adsorption chillers can advantageously provide cooling for facilities and equipment using geothermal energy described herein or can be used for the condensation of atmospheric water vapor.

The generation systems and details regarding the primary heat exchanger described with regard to FIG. 12 can be advantageously used in embodiments having a thermoelectric generator, a Stirling engine, a Matteran cycle, organic Rankine cycle, traditional Rankine cycle, or any other cycle or process described herein.

In some embodiments, for example, where a well has insufficient geothermal pressure or the heat carrier movement within the geothermal formation is lower than desired, steps can be taken to ensure that there is sufficient heat carrier flow within the geothermal formation and the well. For example, hydraulic fracturing can be performed in the area near the well to increase the overall volumetric exposure of the heat carrier to the geothermal formation, and by creating circulation pathways around, over, and on the primary heat exchanger. In some embodiments, the hydraulic fractures can be performed using sand with an average particle diameter of about 80 mesh or 177 micrometers, for example included in the fracturing water. A person of skill in the art, guided by this disclosure, will understand how other sand diameters can be used in the embodiments described herein. In some embodiments, the sand can be coated or mixed with scale inhibiting chemicals. The scale-inhibiting chemicals can be inserted into the hydraulic fracture to prevent scale formation on the outer shell of the primary heat exchanger. Such chemicals can include acrylic acid polymers, maleic acid polymers and phosphonates. In some embodiments, the scale-inhibiting chemicals can be chosen for their desirable solubility, thermal stability, and dosage efficiency characteristics.

Construction of a well can be accomplished by inserting a plurality of support collars as described herein into a drilled well in a geothermal feature. Casing units, or casing segments can be assembled on the surface and then inserted into the well and supported in place by the support collars. In some embodiments, casing segments are individually inserted into the well and are supported by the support collars. When the casing portion is complete, a return pipe can be inserted co-axially into the casing, appropriate inlets and outlets and connections can be made. In some embodiments, the heat exchanger can be inserted into the well as a complete unit, and can be supported by the support collars. When the heat exchanger has scaled or is unable to provide efficient heat transfer, the unit can be removed from the well and replaced with a new heat exchanger or the removed heat exchanger can be cleaned/repaired and reinserted into the well.

It should be apparent that the foregoing relates only to exemplary embodiments of the invention and that numerous changes and modifications may be made herein without departing from the spirit and scope of the application as defined herein.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that the scope of the present invention be limited to the specific embodiments disclosed herein, but that it cover all modifications and alternatives coming within the true scope and spirit of the invention.

The foregoing description details certain embodiments of the systems, devices, and methods disclosed herein. It will be appreciated, however, that no matter how detailed the foregoing appears in text, the systems, devices, and methods can be practiced in many ways. As is also stated above, it should be noted that the use of particular terminology when describing certain features or aspects of the invention should not be taken to imply that the terminology is being re-defined herein to be restricted to including any specific characteristics of the features or aspects of the technology with which that terminology is associated.

It will be appreciated by those skilled in the art that various modifications and changes may be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The term "comprising" as used herein is synonymous with "including," "containing," or "characterized by," and is inclusive or open-ended and does not exclude additional, unrecited elements or method steps.

What is claimed is:

1. A geothermal energy system comprising:
a primary heat exchanger configured for positioning within a well, the well in contact with a geothermal formation and a heat carrier within the geothermal formation, the primary heat exchanger containing a heat transfer fluid configured to absorb heat from the heat carrier, wherein the primary heat exchanger is configured to be supported within the well by a plurality of support collars, each of the plurality of support collars comprising a first and second end, wherein the first ends of the plurality of support collars are securely connected to an inner surface of the well, and wherein the second ends of the plurality of support collars contact a shell of the primary heat exchanger at a point higher in the well than the corresponding first ends of the plurality of support collars.

2. The geothermal energy system of claim 1, wherein the primary heat exchanger is suspended at or near the surface of the earth or the sea floor.

3. The geothermal energy system of claim 1, wherein the heat carrier comprises a thermally conductive material inserted between an outer surface of the primary heat exchanger and the inner surface of the well.

4. The geothermal energy system of claim 1, wherein the plurality of support collars are configured to support the shell of the primary heat exchanger at a position above a bottom of the well.

5. The geothermal energy system of claim 1, wherein the plurality of support collars are configured to be positioned within the well such that the plurality of support collars are in contact with the heat carrier in the geothermal formation, and the heat carrier is able to flow around the plurality of support collars to contact the primary heat exchanger.

6. The geothermal energy system of claim 1, wherein the shell comprises an anti-scaling coating on a well-facing surface of the shell, the coating comprising a very smooth non-metallic material which prevents an ionic bonding site from forming, thus preventing scale formation and also inhibiting corrosion.

7. The geothermal energy system of claim 1, wherein the shell comprises an anti-scaling coating on a well-facing surface of the shell, the coating comprising carbon or boron applied via chemical vapor deposition or vapor deposition alloying.

8. The geothermal energy system of claim 1, wherein the shell comprises an anti-scaling coating on a well-facing surface of the shell, the coating comprising an amorphous carbon material that comprises $sp^3$ hybridized carbon to retard both corrosion and scaling.

9. The geothermal energy system of claim 1, wherein the shell comprises an anti-scaling coating on a well-facing surface of the shell, the coating comprising carbon nitride or boron nitride.

10. The geothermal energy system of claim 1, wherein the shell comprises an anti-scaling coating on a well-facing surface of the shell, the coating comprising highly thermally conductive ceramics which resist scaling and corrosion.

11. The geothermal energy system of claim 1, wherein the shell comprises a well casing, the casing comprising a plurality of casing segments positioned within the well.

12. The geothermal energy system of claim 11, wherein a plurality of centralizers are connected to an inner surface of the casing at junctions between the casing segments.

13. The geothermal energy system of claim 1, wherein the primary heat exchanger is configured to be supported within the well by a cement or grout having high thermal conductivity.

14. The geothermal energy system of claim 1, wherein the primary heat exchanger comprises a supply portion and a return portion, the supply portion comprising the shell in thermal communication with the geothermal formation, and wherein the return portion is concentrically located within the shell of the supply portion.

15. The geothermal energy system of claim 14, wherein the return portion comprises a thermally insulated pipe, wherein the thermally insulated pipe is configured to insulate hot heat transfer fluid in the return portion from relatively colder heat transfer fluid in the supply portion of the primary heat exchanger.

16. The geothermal energy system of claim 15, wherein the thermally insulated pipe is suspended within the shell of the primary heat exchanger via a plurality of centralizers, the centralizers positioned with the shell of the primary heat exchanger such that the heat transfer fluid is in contact with the plurality of centralizers.

17. A method of supporting a primary heat exchanger in a well comprising:
inserting the primary heat exchanger into the well, the primary heat exchanger having a plurality of support collars attached thereto, a first end of each of the plurality of support collars being temporarily connected to an outer surface of the primary heat exchanger via a degradable connection, and a second end of each of the plurality of support collars being moveably attached to the outer surface of the primary heat exchanger; and supporting the primary heat exchanger, via the plurality of support collars, wherein the first ends of the plurality of support collars are securely connected to an inner surface of the well, and wherein the second ends of the plurality of support collars contact a shell of the primary heat exchanger at a point higher in the well than the corresponding first ends of the plurality of support collars.

18. The method of claim 17, wherein the primary heat exchanger within the well is supported via a thermal cement or grout having high thermal conductivity.

19. The method of claim 17, further comprising:
degrading the degradable connection such that the first end of each of the plurality of support collars extends to contact the inner surface of the well.

20. The method of claim 17, wherein the well comprises a casing extending only along a portion of the well, the method further comprising:
drilling, using an under reamer, a portion of the well where the casing does not extend to increase the diameter of the well; and
positioning the primary heat exchanger in the portion of the well having the increased diameter.

\* \* \* \* \*